(12) United States Patent
Natarajan et al.

(10) Patent No.: US 8,703,388 B2
(45) Date of Patent: *Apr. 22, 2014

(54) OPTICAL DATA STORAGE MEDIA

(75) Inventors: Arunkumar Natarajan, Niskayuna, NY (US); Riffard Pierre Jean-Gilles, Albany, NY (US); Kwok Pong Chan, Troy, NY (US); Robert James Perry, Niskayuna, NY (US); Victor Petrovich Ostroverkhov, Ballston Lake, NY (US); Evgenia Mikhailovna Kim, Ballston Lake, NY (US); Julia Lam Lee, Niskayuna, NY (US); Eugene Pauling Boden, Scotia, NY (US); Patrick Joseph McCloskey, Watervliet, NY (US); Brian Lee Lawrence, Cincinnati, OH (US)

(73) Assignee: General Electric Company, Niskayuna, NY (US)

( * ) Notice: Subject to any disclaimer, the term of this patent is extended or adjusted under 35 U.S.C. 154(b) by 98 days.

This patent is subject to a terminal disclaimer.

(21) Appl. No.: 13/405,681

(22) Filed: Feb. 27, 2012

(65) Prior Publication Data

US 2012/0163145 A1   Jun. 28, 2012

Related U.S. Application Data

(63) Continuation-in-part of application No. 12/551,410, filed on Aug. 31, 2009, now Pat. No. 8,124,299.

(51) Int. Cl.
| | |
|---|---|
| *G11B 7/24* | (2013.01) |
| *G03H 1/02* | (2006.01) |
| *G11B 7/249* | (2013.01) |
| *G11B 7/2492* | (2013.01) |

(52) U.S. Cl.
CPC .............. *G11B 7/249* (2013.01); *G11B 7/2492* (2013.01); *G03H 1/02* (2013.01); *G03H 2230/10* (2013.01); *G03H 2260/52* (2013.01); *G03H 2001/0264* (2013.01)

USPC .......... 430/270.16; 369/288; 369/284; 359/3; 430/1; 430/2

(58) Field of Classification Search
None
See application file for complete search history.

(56) References Cited

U.S. PATENT DOCUMENTS

| | | | |
|---|---|---|---|
| 4,879,479 | A | 11/1989 | Frazier et al. |
| 5,223,356 | A | 6/1993 | Kumar et al. |

(Continued)

FOREIGN PATENT DOCUMENTS

| | | |
|---|---|---|
| EP | 1964892 A2 | 9/2008 |
| WO | 9821521 A1 | 5/1998 |
| WO | 2006101873 A2 | 9/2006 |

OTHER PUBLICATIONS

Casalboni et al. "Second harmonic generation and absorption spectra of platinum organometallic complexes incorporated in PMMA films." Chem. Phys. Lett., vol. 319 pp. 107-112 (2000).*
Haskins-Glusac et al., "photophysics and photochemistry of stilbene-containing platinum acetylides" J. Phys. Chem., B. vol. 108(16) pp. 4969=4978 (2004).*
Dini et al., "Nonlinear Optical Effects Related to Saturable and Reverse Absorption by Subphthalocyanines at 532 nm," Chem. Commun,, 2005, pp. 3796-3798.

(Continued)

*Primary Examiner* — Martin Angebranndt
(74) *Attorney, Agent, or Firm* — Joseph J. Christian

(57) ABSTRACT

Optical data storage media for bit-wise recording of a micro-hologram using an incident radiation at a wavelength of about 405 nm are provided. The optical storage medium includes (a) a non-photopolymer polymer matrix; (b) a non-linear sensitizer comprising a phenylethynyl platinum complex, wherein the non-linear sensitizer is capable of triplet-triplet energy transfer from an upper triplet state ($T_n$) of the non-linear sensitizer to a lower triplet state ($T_1$) of a reactant, wherein "n" is an integer greater than 1; and (c) a reactant capable of undergoing a chemical change upon the triplet-triplet energy transfer from the non-linear sensitizer, thereby causing a refractive index change in the medium to record the micro-hologram.

19 Claims, 7 Drawing Sheets

(56) References Cited

U.S. PATENT DOCUMENTS

| | | |
|---|---|---|
| 6,322,931 B1 | 11/2001 | Cumpston et al. |
| 6,402,037 B1 | 6/2002 | Prasad et al. |
| 6,432,610 B1 | 8/2002 | Rentzepis et al. |
| 6,551,682 B1 | 4/2003 | Tosaki et al. |
| 6,947,311 B2 | 9/2005 | Berner et al. |
| 6,969,578 B2 | 11/2005 | Robello et al. |
| 6,969,764 B2 | 11/2005 | Ogiso et al. |
| 7,022,392 B2 | 4/2006 | Dinnocenzo et al. |
| 7,355,775 B2 | 4/2008 | Yam et al. |
| 7,388,695 B2 | 6/2008 | Lawrence et al. |
| 7,452,847 B2 | 11/2008 | Kuboyama et al. |
| 7,459,263 B2 | 12/2008 | Farid et al. |
| 8,124,299 B2 * | 2/2012 | Natarajan et al. .................. 430/1 |
| 8,178,261 B2 * | 5/2012 | Natarajan et al. .................. 430/1 |
| 8,182,967 B2 * | 5/2012 | Natarajan et al. .................. 430/1 |
| 8,475,975 B2 * | 7/2013 | Natarajan et al. .................. 430/1 |
| 2004/0245432 A1 | 12/2004 | Takizawa |
| 2005/0136357 A1 | 6/2005 | Farid et al. |
| 2006/0052471 A1 | 3/2006 | Ashman et al. |
| 2007/0104978 A1 | 5/2007 | Che et al. |
| 2008/0144145 A1 | 6/2008 | Boden et al. |
| 2008/0144146 A1 | 6/2008 | Boden et al. |
| 2008/0158627 A1 | 7/2008 | Lawrence et al. |
| 2008/0247011 A1 | 10/2008 | Lawrence et al. |
| 2013/0128712 A1 * | 5/2013 | Natarajan et al. ............ 369/103 |

OTHER PUBLICATIONS

Rogers et al., "Photophysical Characterization of a Series of Platinum(II)-Containing Phenyl-Ethynyl Oligomers", J. Phys. Chem. A., 2002, vol. 106., pp. 10108-10115.

European Search Report dated Nov. 22, 2010 and Written Opinion.

McKay et al.,"Nonlinear Luninescence spectroscopy in a pt:ethenyl compound", J.Appl.phys, Feb. 1999, vol. 85(3), pp. 1337-1341.

Peng et al.,"A robust photocatalyst for O2-mediated oxidation of cyclopentadiene based on silica-supported platinum (II)terpyridyl complex",Chin, Sci. Bull., Jul. 2004, vol. 49(13), pp. 1428-1430.

Noonan et al.,"Synthesis, charachterization and photochemistry of a Cinnamate-Containing liquid-Crystalline side-Chain Polymer", Chapter 11 in Liquid crystalline polymers, Weiss , 1990, pp. 144-157.

Rogers et al., "Platinum Acetylide two-photon chromophores", Inorg. Chem., Jul. 2007, vol. 46(16), pp. 6483-6494.

Zhan et al.,"Transition metal acetyiide catalysts for polymerization of p-diethynylbenzene4 Effect of transition metals catalytic activity of cornpiexes",J.Mole. Cat., A., Chem., 2002, vol. 184, pp. 139-145.

Lee et al.,"A Photochromic platinum(II) bis(alkynyl) complex containing versatile 5, 6-dithienyl-1, 10-phenathroline", Organomet., Dec. 2006, vol. 26(1), pp. 12-15.

Irie "Diarylethenes for memories and switches ", Chem. Rev. Apr. 2000, vol. 100(5), pp. 1685-1716.

* cited by examiner

OPTICAL DATA STORAGE MEDIA

CROSS-REFERENCE TO RELATED APPLICATIONS

This application claims priority to non-provisional application Ser. No. 12/551,410 filed on Aug. 31, 2009, the entire contents of which are hereby incorporated by reference.

BACKGROUND

1. Technical Field

The present disclosure relates to optical data storage media. More particular, the present disclosure relates to optical storage media for bit-wise recording of microholographic data at 405 nm.

2. Discussion of Related Art

Holographic storage is optical data storage in which the data is represented as holograms, which are images of three dimensional interference patterns created by the intersection of two beams of light in a photosensitive medium. More particularly, the superposition of a reference beam and a signal beam, containing digitally encoded data, forms a 3-D interference pattern within the volume of the medium resulting in a chemical reaction that changes or modulates the refractive index of the photosensitive medium (recording or writing step). This modulation records both the intensity and phase information from the signal as the hologram. The hologram can later be retrieved by exposing the storage medium to the reference beam alone, which interacts with the stored holographic data to generate a reconstructed signal beam proportional to the initial signal beam used to store the holographic image (reading step).

Recent research into holographic data storage has focused on a bit-wise approach for recording data, where each bit (or few bits) of information is represented by a hologram localized to a microscopic volume within a medium to create a region that reflects the readout light. Such localized volume holographic micro-reflectors may be arranged into multiple data layers throughout the volume of the medium. Materials capable of accommodating a bit-wise data storage approach are highly sought after as the equipment utilized to read and write to such material is either currently commercially available, or readily provided with modifications to commercially available reading and writing equipment.

However, conventional methods of storing bit-wise holographic data employ linear photosensitive materials or materials susceptible to photochemical change independent of the power density (intensity) of incident radiation. These linear materials are also susceptible to photochemical change at both the writing and reading conditions. Moreover, in the bit-wise approach, the readout and recording of data in the layers inevitably leads to exposure of the adjacent layers to the recording/readout radiation. Therefore, conventional methods of recording/reading bit-wise holographic medium using linear materials could lead to unintended erasure or data loss in the medium during recording/reading.

Thus, there is a need for holographic storage medium data that allow for writing of data without affecting other layers of data during the writing step. Further, there remains a need for optical data storage media that can exhibit a non-linear response to the recording light intensity and that are suitable for bit-wise holographic data storage.

BRIEF DESCRIPTION

In one embodiment, an optical storage medium for bit-wise recording of a microhologram using an incident radiation at a wavelength of about 405 nm is provided. The optical storage medium includes a) a non-photopolymer polymer matrix; (b) a non-linear sensitizer comprising a phenylethynyl platinum complex, wherein the non-linear sensitizer is capable of triplet-triplet energy transfer from an upper triplet state ($T_n$) of the non-linear sensitizer to a lower triplet state ($T_1$) of a reactant, wherein "n" is an integer greater than 1; and (c) a reactant capable of undergoing a chemical change upon the triplet-triplet energy transfer from the non-linear sensitizer, thereby causing a refractive index change in the medium to record the microhologram.

In another embodiment, an optical storage medium for bit-wise recording of a microhologram using an incident radiation at a wavelength of about 405 nm is provided. The optical storage medium includes (a) a non-photopolymer polymer matrix; (b) a non-linear sensitizer including a sequential two-photon reverse saturable absorber comprising a phenylethynyl platinum complex, wherein the non-linear sensitizer is capable of triplet-triplet energy transfer from an upper triplet state ($T_n$) of the non-linear sensitizer to a lower triplet state ($T_1$) of a reactant, wherein "n" is an integer greater than 1; and (c) a reactant capable of undergoing a chemical change upon the triplet-triplet energy transfer from the non-linear sensitizer, thereby causing a refractive index change in the medium to record the microhologram, wherein a difference between a lowest triplet ($T_1$) energy of the reactant and a lowest triplet ($T_1$) energy of the non-linear sensitizer is greater than about 2 kcal/mole.

In yet another embodiment, an optical storage medium for bit-wise recording of a microhologram using an incident radiation at a wavelength of about 405 nm is provided. The optical storage medium includes (a) a non-photopolymer polymer matrix; (b) a non-linear sensitizer including a sequential two-photon reverse saturable absorber comprising a phenylethynyl platinum complex, wherein the non-linear sensitizer is capable of triplet-triplet energy transfer from an upper triplet state ($T_n$) of the non-linear sensitizer to a lower triplet state ($T_1$) of a reactant, wherein "n" is an integer greater than 1; and (c) a reactant comprising stilbenes, cinnamates, cinnamades, or combinations thereof, wherein the reactant is capable of undergoing a chemical change upon the triplet-triplet energy transfer from the non-linear sensitizer, thereby causing a refractive index change in the medium to record the microhologram, wherein a difference between a lowest triplet ($T_1$) energy of the reactant and a lowest triplet ($T_1$) energy of the non-linear sensitizer is greater than about 2 kcal/mole.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
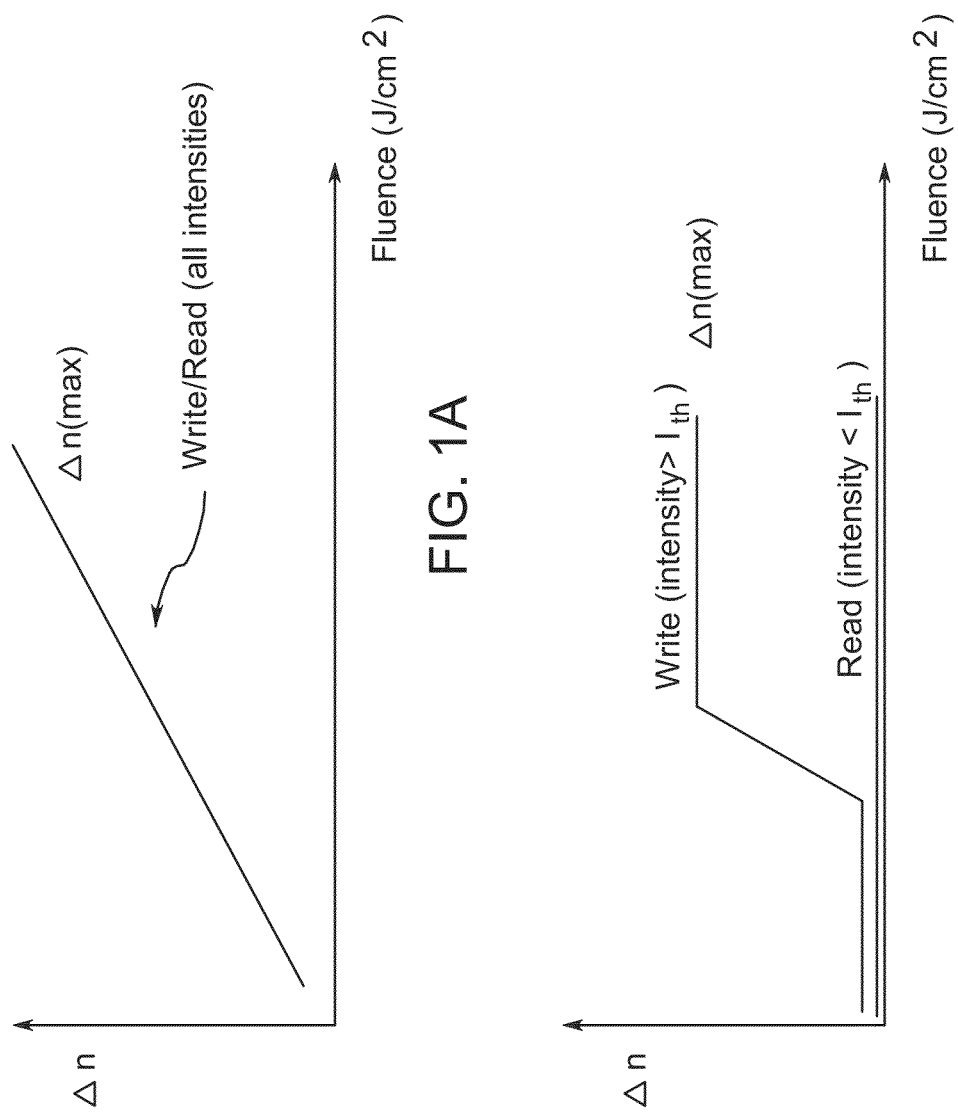
FIG. 1A is a graphical depiction of the response of a linear sensitizer to incident radiation.
FIG. 1B is a graphical depiction of the response of a non-linear (threshold) sensitizer to incident radiation.

In the following specification and the claims, the singular forms "a", "an" and "the" include plural referents unless the context clearly dictates otherwise.

As defined herein, the term "optically transparent" as applied to an optically transparent substrate or an optically transparent material means that the substrate or material has an absorbance of less than 1. That is, at least 10 percent of incident light is transmitted through the material at least one wavelength in a range between about 300 nanometers and about 1500 nanometers. For example, when configured as a film having a thickness suitable for use in holographic data storage medium said film exhibits an absorbance of less than 1 at least one wavelength in a range between about 300 nanometers and about 1500 nanometers.

As used herein, the term "volume element" means a three dimensional portion of total volume.

As used herein, the term "diffraction efficiency" means a fraction of the beam power reflected by a hologram as measured at the hologram location with respect to the incident probe beam power, while the term "quantum efficiency" means a probability of an absorbed photon to result in a chemical change that produces a refractive index change.

As used herein, the term "fluence" means the amount of optical beam energy that has traversed a unit area of the beam cross-section (measured, for example, in Joule/cm$^2$), while the term "intensity" means optical radiative flux density, e.g. amount of energy traversing a unit area of beam cross-section in unit time (measured in, for example, Watt/cm$^2$).

As used herein, the term "sensitivity" is defined as the amount of index change obtained with respect to the amount of fluence used to irradiate a spot of the film with the laser tight. If we know the fluence (F) value and the amount of index change we can estimate sensitivity (S) of the energy transfer process using the formula:

Sensitivity=$dn/F$ wherein dn=percentage conversion×dn (max), dn (max) is the maximum capacity index change material;

$F$=actual fluence.

As used herein, "$T_1$" state is the lowest triplet energy of any molecule such as, for example, a reactant or a sensitizer.

As used herein, the term "aromatic radical" refers to an array of atoms having a valence of at least one including at least one aromatic group. The array of atoms having a valence of at least one including at least one aromatic group may include heteroatoms such as nitrogen, sulfur, selenium, silicon and oxygen, or may be composed exclusively of carbon and hydrogen. As used herein, the term "aromatic radical" includes but is not limited to phenyl, pyridyl, furanyl, thienyl, naphthyl, phenylene, and biphenyl radicals. As noted, the aromatic radical contains at least one aromatic group. The aromatic group is invariably a cyclic structure having 4n+2 "delocalized" electrons where "n" is an integer equal to 1 or greater, as illustrated by phenyl groups (n=1), thienyl groups (n=1), furanyl groups (n=1), naphthyl groups (n=2), azulenyl groups (n=2), anthraceneyl groups (n=3) and the like. The aromatic radical may also include nonaromatic components. For example, a benzyl group is an aromatic radical which includes a phenyl ring (the aromatic group) and a methylene group (the nonaromatic component). Similarly a tetrahydronaphthyl radical is an aromatic radical including an aromatic group ($C_6H_3$) fused to a nonaromatic component —$(CH_2)_4$—. For convenience, the term "aromatic radical" is defined herein to encompass a wide range of functional groups such as alkyl groups, alkenyl groups, alkynyl groups, haloalkyl groups, haloaromatic groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylphenyl radical is a $C_7$ aromatic radical including a methyl group, the methyl group being a functional group which is an alkyl group. Similarly, the 2-nitrophenyl group is a $C_6$ aromatic radical including a nitro group, the nitro group being a functional group. Aromatic radicals include halogenated aromatic radicals such as 4-trifluoro methyl phenyl, hexafluoro isopropylidene his (4-phen-1-yloxy) (i.e., —OPhC($CF_3$)$_2$PhO—); 4-chloromethylphen-1-yl, 3-trifluorovinyl-2-thienyl, 3-trichloro methylphen-1-yl (i.e., 3-CCl$_3$Ph-); 4-(3-bromoprop-1-yl)phen-1-yl (i.e., 4-BrCH$_2$CH$_2$CH$_2$Ph-); and the like. Further examples of aromatic radicals include 4-allyloxyphen-1-oxy; 4-aminophen-1-yl (i.e., 4-H$_2$NPh-); 3-aminocarbonylphen-1-yl (i.e. NH$_2$COPh-); 4-benzoylphen-1-yl; dicyano methylidene his (4-phen-1-yl oxy) (i.e., —OPhC(CN)$_2$PhO—); 3-methylphen-1-yl, methylene his (4-phen-1-yl oxy) (i.e., —OPhCH$_2$PhO—); 2-ethylphen-1-yl, phenyl ethenyl, 3-formyl-2-thienyl, 2-hexyl-5-furanyl; hexamethylene-1,6-bis(4-phen-1-yl oxy) (i.e., —OPh(CH$_2$)$_6$PhO—); 4-hydroxy methylphen-1-yl (i.e., 4-HOCH$_2$Ph-); 4-mercapto methylphen-1-yl (i.e., 4-HSCH$_2$Ph-); 4-methylthiophen-1-yl (i.e., 4-CH$_3$SPh-); 3-methoxyphen-1-yl; 2-methoxy carbonyl phen-1-yl oxy (e.g., methyl salicyl); 2-nitromethylphen-1-yl (i.e., 2-NO$_2$CH$_2$Ph); 3-trimethylsilylphen-1-yl; 4-t-butyl dimethylsilylphenl-1-yl; 4-vinylphen-1-yl; vinylidene his (phenyl); and the like. The term "a $C_3$-$C_{10}$ aromatic radical" includes aromatic radicals containing at least three but no more than 10 carbon atoms. The aromatic radical 1-imidazolyl ($C_3H_2N_2$—) represents a $C_3$ aromatic radical. The benzyl radical ($C_7H_7$—) represents a $C_7$ aromatic radical.

As used herein the term "cycloaliphatic radical" refers to a radical having a valence of at least one, and including an array of atoms which is cyclic but which is not aromatic. As defined herein a "cycloaliphatic radical" does not contain an aromatic group. A "cycloaliphatic radical" may include one or more noncyclic components. For example, a cyclohexylmethyl group ($C_6H_{11}CH_2$—) is a cycloaliphatic radical which includes a cyclohexyl ring (the array of atoms which is cyclic but which is not aromatic) and a methylene group (the noncyclic component). The cycloaliphatic radical may include heteroatoms such as nitrogen, sulfur, selenium, silicon and oxygen, or may be composed exclusively of carbon and hydrogen. For convenience, the term "cycloaliphatic radical" is defined herein to encompass a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methyl cyclopent-1-yl radical is a $C_6$ cycloaliphatic radical including a methyl group, the methyl group being a functional group which is an alkyl group. Similarly, the 2-nitrocyclobut-1-yl radical is a $C_4$ cycloaliphatic radical including a nitro group, the nitro group being a functional group. A cycloaliphatic radical may include one or more halogen atoms which may be the same or different. Halogen atoms include, for example; fluorine, chlorine, bromine, and iodine. Cycloaliphatic radicals including one or more halogen atoms include 2-trifluoro methylcyclohex-1-yl; 4-bromo difluoro methyl cyclo oct-1-yl; 2-chloro difluoro methylcyclohex-1-yl; hexafluoro isopropylidene-2, 2-bis (cyclohex-4-yl) (i.e., —$C_6H_{10}C(CF_3)_2C_6H_{10}$—); 2-chloro methylcyclohex-1-yl; 3-difluoro methylene cyclohex-1-yl; 4-trichloro methyl cyclohex-1-yloxy; 4-bromo dichloro methylcyclohex-1-yl thio; 2-bromo ethyl cyclopent-1-yl; 2-bromo propyl cyclo hex-1-yloxy (e.g., $CH_3CHBrCH_2C_6H_{10}O$—); and the like. Further examples of cycloaliphatic radicals include 4-allyl oxycyclo hex-1-yl; 4-amino cyclohex-1-yl (i.e., $H_2NC_6H_{10}$—); 4-amino carbonyl cyclopent-1-yl (i.e., $NH_2COC_5H_8$—); 4-acetyl oxycyclo hex-1-yl; 2,2-dicyano isopropylidene his (cyclohex-4-yloxy) (i.e., —$OC_6H_{10}C(CN)_2C_6H_{10}$—); 3-methyl cyclohex-1-yl; methylene bis(cyclohex-4-yloxy) (i.e., —$OC_6H_{10}CH_2C_6H_{10}O$—); 1-ethyl cyclobut-1-yl; cyclo propyl ethenyl, 3-formyl-2-terahydrofuranyl; 2-hexyl-5-tetrahydrofuranyl; hexamethylene-1,6-bis(cyclohex-4-yloxy) (i.e., —$OC_6H_{10}(CH_2)_6C_6H_{10}O$—); 4-hydroxy methylcyclohex-1-yl (i.e., 4-$HOCH_2C_6H_{10}$—), 4-mercapto methyl cyclohex-1-yl 4-$HSCH_2C_6H_{10}$, 4-methyl thiocyclohex-1-yl (i.e., 4-$CH_3SC_6H_{10}$—); 4-methoxy cyclohex-1-yl, 2-methoxy carbonyl cyclohex-1-yloxy (2-$CH_3OCOC_6H_{10}O$—), 4-nitro methyl cyclohex-1-yl (i.e., $NO_2CH_2C_6H_1$)—); 3-trimethyl silyl cyclohex-1-yl; 2-t-butyl dimethylsilylcyclopent-1-yl; 4-trimethoxy silylethyl cyclohex-1-yl (e.g., $(CH_3O)_3$ $SiCH_2CH_2C_6H_{10}$—); 4-vinyl cyclohexen-1-yl; vinylidene bis(cyclohexyl), and the like. The term "a $C_3$-$C_{10}$ cycloaliphatic radical" includes cycloaliphatic radicals containing at least three but no more than 10 carbon atoms. The cycloaliphatic radical 2-tetrahydrofuranyl ($C_4H_7O$—) represents a $C_4$ cycloaliphatic radical. The cyclohexylmethyl radical ($C_6H_{11}CH_7$—) represents a $C_7$ cycloaliphatic radical.

As used herein the term "aliphatic radical" refers to an organic radical having a valence of at least one consisting of a linear or branched array of atoms which is not cyclic. Aliphatic radicals are defined to include at least one carbon atom. The array of atoms including the aliphatic radical may include heteroatoms such as nitrogen, sulfur, silicon, selenium and oxygen or may be composed exclusively of carbon and hydrogen. For convenience, the term "aliphatic radical" is defined herein to encompass, as part of the "linear or branched array of atoms which is not cyclic" a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylpent-1-yl radical is a $C_6$ aliphatic radical including a methyl group, the methyl group being a functional group which is an alkyl group. Similarly, the 4-nitrobut-1-yl group is a $C_4$ aliphatic radical including a nitro group, the nitro group being a functional group. An aliphatic radical may be a haloalkyl group which includes one or more halogen atoms which may be the same or different. Halogen atoms include, for example; fluorine, chlorine, bromine, and iodine. Aliphatic radicals including one or more halogen atoms include the alkyl halides trifluoromethyl; bromodifluoromethyl; chlorodifluoromethyl; hexafluoroisopropylidene; chloromethyl; difluorovinylidene; trichloromethyl; bromodichloromethyl; bromoethyl; 2-bromotrimethylene (e.g., —$CH_2CHBrCH_2$—); and the like. Further examples of aliphatic radicals include allyl; aminocarbonyl (i.e., —$CONH_2$); carbonyl; 2,2-dicyano isopropylidene (i.e., —$CH_2C(CN)_2CH_2$—); methyl (i.e., —$CH_3$); methylene (i.e., —$CH_2$—); ethyl; ethylene; formyl (i.e., —CHO); hexyl; hexamethylene; hydroxymethyl (i.e., —$CH_2OH$); mercaptomethyl (i.e., —$CH_2SH$); methylthio (i.e., —$SCH_3$); methylthiomethyl (i.e., —$CH_2SCH_3$); methoxy; methoxycarbonyl (i.e., $CH_3OCO$—); nitromethyl (i.e., —$CH_2NO_2$); thiocarbonyl; trimethylsilyl (i.e., $(CH_3)_3Si$—); t-butyldimethylsilyl; 3-trimethyoxysilylpropyl (i.e., $(CH_3O)_3$ $SiCH_2CH_2CH_2$—); vinylidene; and the like. By way of further example, a $C_1$-$C_{10}$ aliphatic radical contains at least one but no more than 10 carbon atoms. A methyl group (i.e., $CH_3$—) is an example of a $C_1$ aliphatic radical. A decyl group (i.e., $CH_3(CH_2)_9$—) is an example of a $C_{10}$ aliphatic radical.

As noted earlier, an optical data storage medium is provided. The optical storage medium includes (a) a non-photopolymer polymer matrix; (b) a non-linear sensitizer including a phenylethynyl platinum complex; and (c) a reactant. As described in detail herein, the non-linear sensitizer is capable of triplet-triplet energy transfer from an upper triplet state ($T_n$) of the non-linear sensitizer to a lower triplet state ($T_1$) of a reactant. Further, the reactant is capable of undergoing a chemical change upon the triplet-triplet energy transfer from the non-linear sensitizer, thereby causing a refractive index change in the medium to record the microhologram.

As used herein, the term "non-linear sensitizer" refers to a material that has a sensitivity having dependence to the light intensity, that is, the sensitivity is high at the high (recording) intensity and low at the lower (readout) intensity. For example, in a situation where the read intensity is about 20 to about 50 times lower than the write intensity, the sensitivity (based on specific assumptions on the readout life time and/or number of readout cycles the material has to survive) decrease by an order greater than about 100 times the initial sensitivity. This difference in the intensity and sensitivity constitutes the amount of nonlinearity the material has to exhibit. The terms "non-linear sensitizer" and "threshold sensitizer" are used herein interchangeably.

This is further illustrated in FIGS. 1A and 1B. FIG. 1A shows the response of a linear photosensitive material to incident radiation, while FIG. 1B shows the response of a non-linear sensitizer to incident radiation. As is shown in FIG. 1A, linear photosensitive materials may cause a reaction at any power density (intensity) of recording light and the amount of the refractive index change ($\Delta n$) achieved may be the same for the same radiative energy (fluence) received by the material. In contrast, non-linear sensitizers may only cause a reaction at and over a certain light intensity of recording light.

In particular embodiments, the non-linear sensitizers include sequential two-photon reverse saturable absorbers (RSAs). As used herein, the term "reverse saturable absorber" or "RSA" refers to a compound that has extremely low linear absorption at a given wavelength, and transmits nearly all of the light at this wavelength. However, when subjected to high intensity radiation at these given wavelengths, low level linear absorption can lead to a state where the molecule has a higher absorption cross section and becomes highly absorbing at that same wavelength; causing it to strongly absorb subsequent photons. This nonlinear absorption is often referred to as sequential two-photon absorption.

Suitable examples of non-linear sensitizers include RSAs that experience photoexcitation when irradiated upon by incident radiation having a wavelength of about 405 nanometers intensity greater than a threshold value. Because this wavelength is within the blue color portion of the visible spectrum, these RSA's may typically be referred to as "blue" RSA's. In one embodiment, the non-linear sensitizer is capable of exhibiting reverse saturable absorber characteristics at 405 nanometers so that the storage capacity of the media is optimized, while the media is yet compatible with current conventional storage formats, for example, Blu-ray.

In one embodiment, the non-linear sensitizer has low absorbance or extinction coefficient at a wavelength of about 405 nanometers. In one embodiment, the non-linear sensitizer has an extinction coefficient less than about 200 $cm^{-1}M^{-1}$ at a wavelength of about 405 nanometers. In one embodiment, the non-linear sensitizer has low ground state absorption and very high excited state absorption (RSA property) at a wavelength of about 405 nanometers.

In some embodiments, the non-linear sensitizer includes a platinum phenylethynyl complex. In some embodiments, the non-linear sensitizer includes a trans platinum phenylethynyl complex. Platinum ethynyl complexes suitable for use in the optical data storage media include a complex in which the platinum participates in the delocalization of the π-electron system and/or possesses triplet energy levels which connect to singlet state transitions via intersystem crossings.

In some embodiments, the non-linear sensitizer includes a bis(alkyl phosphine) platinum phenylethynyl complex. In one embodiment, the non-linear sensitizer includes bis(tributylphosphine)bis(4-ethynylbiphenyl)platinum (PPE), bis(tributylphosphine)bis(4-ethynyl-1-(2-phenylethynyl)benzene)platinum (PE2), bis(1-ethynyl-4-(4-n-butylphenylethynyl)benzene)bis(tri-n-butyl)phosphine)Pt(II), (n-Bu-PE2), bis(1-ethynyl-4-(4-fluorophenylethynyl)benzene)bis(tri-n-butyl)phosphine)Pt(II)(F-PE2), bis(1-ethynyl-4-(4methoxyphenylethynyl)benzene)bis(tri-n-butyl)phosphine)Pt(II) (MeO-PE2), bis(1-ethynyl-4-(4-methylphenylethynyl)benzene)bis(tri-n-butyl)phosphine)Pt(II) (Me-PE2), bis(1-ethynyl-4(3,5-dimethoxyphenylethynyl)benzene)bis(tri-nbutylphosphine)Pt(II) (3,5-diMeO-PE2), bs(1-ethynyl-4(4-N,N-dimethylaminophenylethynyl)benzene)bis(tri-n-butyl-phosphine)Pt(II) (DMA-PE2), or combinations thereof.

The non-linear sensitizers suitable for use in optical storage medium of the present invention are capable of absorbing incident radiation at about 405 nm only if the intensity of incident radiation is greater than a threshold value. The term "threshold value" refers to the intensity of incident radiation above which the non-linear sensitizer has an absorption greater than the absorption if the intensity was lower that than the threshold value. In one embodiment, the threshold value is at least 2 orders of magnitude greater than the ambient light. In one embodiment, the threshold value is in a range from about 20 $MW/cm^2$ to about 300 $MW/cm^2$. In one embodiment, the threshold value is in a range from about 50 $MW/cm^2$ to about 300 $MW/cm^2$.

Further, the non-linear sensitizers are substantially transparent to incident radiation at about 405 nm if the intensity is substantially lower than the threshold value. In one embodiment, the threshold value below which the non-linear sensitizer is substantially transparent is in a range from about 5 $MW/cm^2$ to about 50 $MW/cm^2$. In one embodiment, the threshold value below which the non-linear sensitizer is substantially transparent is in a range from about 5 $MW/cm^2$ to about 20 $MW/cm^2$. The term "substantially transparent" as used herein mean that the absorption of incident radiation at a particular wavelength is less than about 10 percent.

Figure 3:
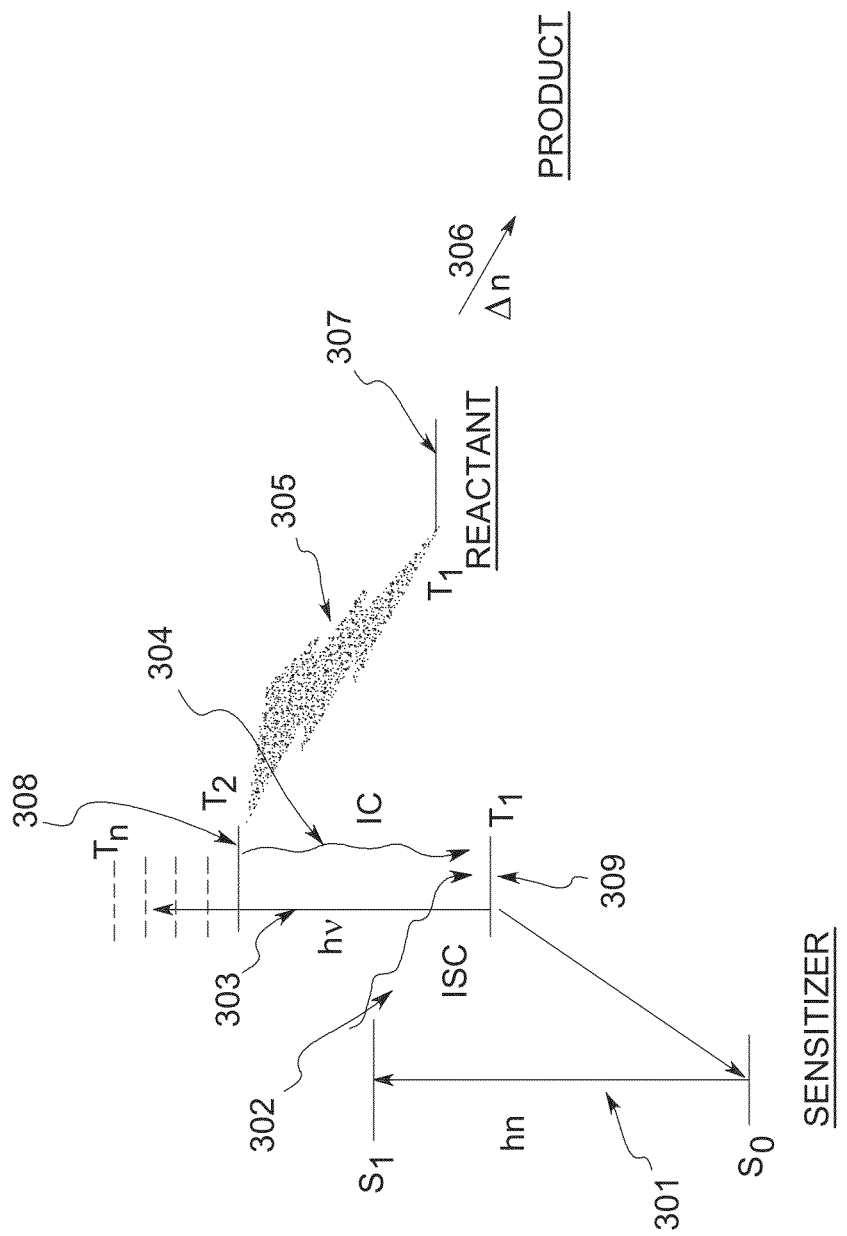
FIG. 3 is a schematic energy level diagram showing the upper triplet $T_n$, excited state absorption and resulting energy transfer for a sensitizer exhibiting reverse saturable absorption.

As noted earlier, the non-linear sensitizer is capable of absorbing the incident radiation at about 405 nm when the intensity of the incident radiation is greater than a threshold value, thereby transitioning to the upper triplet state $T_n$. This is further illustrated in FIG. 3. FIG. 3 is a schematic energy level diagram showing the upper triplet $T_n$ excited state absorption and resulting energy transfer for a sensitizer exhibiting reverse saturable absorption. As shown in energy level diagram 300, arrow 301 illustrates the ground state absorption cross section of a photon as it transitions from the singlet ground state $S_0$ to a first excited state $S_1$. The intersystem-crossing rate, represented by arrow 302, signifies the transfer of energy that occurs when the sensitizer moves from an excited singlet state $S_1$ to a corresponding triplet state $T_1$. Arrow 303 indicates the excited triplet state absorption cross section. Thus, if the intensity of incident radiation is greater than a threshold value, the non-linear sensitizer absorbs a first photo to transition to a first excited state $S_1$, followed by intersystem crossing to the triplet state $T_1$ and subsequent absorption of a second photon, thereby transitioning to the upper triplet state $T_n$.

As noted earlier, the non-linear sensitizer is capable of triplet-triplet energy transfer from an upper triplet state $(T_n)$ of the non-linear sensitizer to a lower triplet state $(T_1)$ of a reactant. The term "upper triplet energy transfer" as used herein refers to non-radiative transfer of energy between the upper triplet energy state $(T_n)$ of the non-linear sensitizer and the $T_1$ state of the reactant, wherein "n" is an integer greater than 1.

This step of upper triplet energy transfer is further illustrated in FIG. 3. Once the upper level triplet state $T_n$ is achieved by subsequent linear absorption of a second photon by the non-linear sensitizer, two upper excited decay processes are possible. One possible decay process, denoted by arrow 304 in FIG. 3, is the non-radiative relaxation by internal conversion (IC) to the lower lying $T_1$ state. The other possible decay process is denoted by arrow 305 in FIG. 3, and involves the release of energy from the sensitizer and the transfer of this energy to the reactant via "triplet-triplet energy transfer".

Further in some embodiments, once the sensitizers described herein transfer the absorbed energy to the reactant, they return to their original state, and may repeat the process many times over. The sensitizers thus do not get substantially consumed over time, although their ability to absorb energy and release it to one or more reactants may degrade over time. This is in contrast to materials known conventionally as photosensitive materials, which can absorb energy (typically a single photon) and not transfer it to other molecules, but undergo conversion to a new structure, or react with another molecule to form a new compound in doing so.

The optical storage medium further includes a reactant capable of undergoing a chemical change upon the triplet-triplet energy transfer from the non-linear sensitizer, thereby causing a refractive index change in the medium to record the microhologram. As used herein the term "reactant" refers to a material capable of undergoing a chemical change to form a "product", which results in modulation of refractive index change within the medium. This is in contrast to photopolymer-based recording of optical data storage medium where modulation of refractive index is affected by polymerization of a monomer, which may lead to dimensional changes of the optical data storage medium. Further, this is in contrast to photoresist systems where the reactant is rendered soluble/insoluble in the presence of an acid, but the refractive index is not modulated.

Further, the reactant according to embodiments of the invention is substantially non-responsive to the incident radiation during the recording/writing step. The term "non-responsive" as used in this context means that the reactant is substantially transparent to or does not absorb the incident radiation irradiated onto the optical storage medium during the recording or writing step. Accordingly, the reactant is substantially non-responsive to the incident irradiation in the absence of the nonlinear sensitizer. In particular embodiments, the reactant has low absorbance or extinction coefficient at a wavelength of about 405 nanometers.

In some embodiments, a lowest triplet ($T_1$) energy of the reactant is greater than a lowest triplet energy ($T_1$) of the non-linear sensitizer and lower than or substantially equal to the upper triplet ($T_n$) energy of the non-linear sensitizer. This is further illustrated in FIG. 3. Referring again to FIG. 3, in some embodiments, the reactant has a triplet energy denoted by arrow 307 below or substantially equal to that of the $T_2$ state of the sensitizer denoted by arrow 308, but above that of the $T_1$ state of the sensitizer, shown at arrow 309. The reactant is also capable of receiving energy from an upper triplet state ($T_2$ or higher) of the sensitizer, and undergoing a reaction to form a product, providing a refractive index change within the polymer matrix and thus, a recorded hologram.

In some embodiments, a difference between the lowest triplet ($T_1$) energy of the reactant and the lowest triplet ($T_1$) energy of the non-linear sensitizer is greater than about 2 kcal/mole. In some embodiments, a difference between the lowest triplet ($T_1$) energy of the reactant and the lowest triplet ($T_1$) energy of the non-linear sensitizer is greater than about 6 kcal/mole. In some embodiments, a difference between the lowest triplet ($T_1$) energy of the reactant and the lowest triplet ($T_1$) energy of the non-linear sensitizer is greater than about 10 kcal/mole. Thus, in accordance with embodiments of the invention, the energy transfer between the non-linear sensitizer and the reactant is substantially affected from the upper triplet energy state ($T_n$) of the sensitizer in comparison to energy transfer from the lowest triplet energy state ($T_1$) of the non-linear sensitizer.

As noted, the reactant is capable of undergoing a change upon triplet triplet energy transfer. As used herein, the term "change" is meant to include any reaction of the reactant, for example, dimerization or isomerization. Dimerization is a bimolecular chemical process involving an electronically excited unsaturated molecule that undergoes addition with an unexcited molecule of a structurally similar and/or identical species (for example, two olefins combining to form a cyclobutane ring structure). The covalent bonding that occurs in this reaction produces a new moiety which can be generally classified as a product.

Examples of reactants suitable for use in some embodiments of the optical storage media described herein include, but are not limited to, (i) those that can undergo dimerization so that less volume change is required to go from reactant to product, e.g., reactants that undergo dimerization processes not by direct photoexcitation of the reactant but by indirect "non-radiative energy transfer" (for example, triplet-to-triplet energy transfer) pathway from the photoexcited sensitizer to the reactant; (ii) those for which a nonlinear sensitizer receives energy from a two-photon process and delivers that energy to one reactant that subsequently condenses with a second reactant to provide a product; (iii) those that, when derivatized on a polymer backbone may provide a very large refractive index change, which corresponds to the available capacity of the material, e.g., a $\Delta n_{max}$ of at least about 0.08 can be achieved if >85% of the reactants are converted to product; and (iv) those that, when derivatized on a polymer backbone, are capable of undergoing both inter- and intramolecular condensation reactions, thereby accelerating the consumption thereof, and providing desired refractive index ($\Delta n$) changes with incident fluence of less than 10 J/cm$^2$ as a result of higher quantum efficiency of the sensitized photo-reaction, which in turn may also provide greater diffraction efficiencies and shorter recording times within an optical data storage medium.

As noted earlier, a reactant having a triplet energy state between the $T_1$ and $T_2$ states of the sensitizer may be utilized, and, selection of an appropriate reactant may thus depend upon the selection of the desired sensitizer. In some embodiments, suitable reactants include, but are not limited to, stilbenes. Suitable examples of stilbenes include meta- (or) para-substituted stilbenes. Specific examples of stilbenes include, but are not limited to, meta- (or) para-halogen (F, Cl, Br, or I) substituted stilbene, meta- (or) para-trans-methylstilbene, trans-[meta- (or) para]cyanostilbene, trans-[meta- (or) para]-methoxystilbene, [3,3'] or [4,4'], or [2,4] or [3,4]dimethoxy, difluoro, dibromo, dichloro, diiodo, substituted trans-stilbenes, trans-2,4,6-trimethylstilbene, trans-2,2',4,4',6,6'-hexamethylstilbene, or combinations thereof.

In some embodiments, suitable reactants include (E)-1-methoxy-4-styrylbenzene, (E)-1-fluoro-4-styrylbenzene, (E)-1-chloro-4-styrylbenzene, (E)-1-bromo-4-styrylbenzene, (E)-1-iodo-4-styrylbenzene, (E)-1-methoxy-3-styrylbenzene, (E)-1-fluoro-3-styrylbenzene, (E)-1-chloro-3-styrylbenzene, (E)-1-bromo-3-styrylbenzene, (E)-1-iodo-3-styrylbenzene, (E)-1-cyano-4-styrylbenzene, or combinations thereof.

In some embodiments, suitable reactants include (E)-1,2-bis(4-methoxyphenyl)ethene, (E)-1,2-bis(4-fluorophenyl)ethene, (E)-1,2-bis(4-chlorophenyl)ethene, (E)-1,2-bis(4-bromophenyl)ethene, (E)-1,2-bis(4-iodophenyl)ethene, (E)-1,2-bis(3-methoxyphenyl)ethene, (E)-1,2-bis(3-fluorophenyl)ethene, (E)-1,2-bis(3-chlorophenyl)ethene, (E)-1,2-bis(3-bromophenyl)ethene, (E) 1,2-bis(3 iodophenyl)ethene, or combinations thereof.

In some embodiments, suitable reactants include (E)-1-methoxy-2-(4-methoxystyryl)benzene, (E)-1-fluoro-2-(4-fluorostyryl)benzene, (E)-1-chloro-2-(4-chlorostyryl)benzene, (E)-1-bromo-2-(4-bromostyryl)benzene, (E)-1-iodo-2-(4-iodostyryl)benzene, (E)-1-iodo-2-(4-cyanostyryl) benzene, (F)-1-methoxy-3-(4-methoxystyryl)benzene, (E)-1-fluoro-3-(4-fluorostyryl)benzene, (E)-1-chloro-3-(4-chlorostyryl)benzene, (E)-1-bromo-3-(4-bromostyryl) benzene, (E)-1-iodo-3-(4-iodostyryl)benzene, (E)-1-iodo-3-(4-cyanostyryl)benzene, (E)-1-methoxy-2-(3-methoxystyryl)benzene, (E)-1-fluoro-2-(3-fluorostyryl) benzene, (E)-1-chloro-2-(3-chlorostyryl)benzene, (E)-1-bromo-2-(3-bromostyryl)benzene, (E)-1-iodo-2'(3' iodostyryl)benzene, (E)-1-iodo-2-(3-cyanostyryl)benzene, or combinations thereof.

In some embodiments, the reactant includes cinnamates, cinnamamides, or combinations thereof such as those described in U.S. patent application Ser. No. 12/550,521, entitled "Optical Data Storage Media and Methods of Using the Same", filed on 31 Aug. 2009 and Ser. No. 12/967,409, entitled "Optical Data Storage Media and Methods of Using the Same", filed on 14 Dec., 2010, and incorporated herein by reference in their entirety for any and all purposes, so long as not directly contradictory with the teachings herein. In some embodiments, the reactants are chosen to have negligible UV absorption at 405 nm, in order to keep the linear bleaching of the cinnamate to a minimum and to facilitate only the triplet-triplet energy transfer from the excited sensitizer.

In certain embodiments, the cinnamate materials include polyvinylcinnamates (PVCm). In some embodiments, the cinnamate content of the polyvinyl backbone varies in a range from about 54 weight percent to about 75 weight percent based upon the total weight of the polyvinylcinnamate. Suitable examples of polyvinylcinnamates and cinnamamides include, but are not limited to, polyvinylcinnamate (PVCm), polyvinyl 4-chlorocinnamate (PVClCm), polyvinyl 4-methoxycinnamate (PVMeOCm), (2E,2'E)-((1S,2S)-cyclohexane-1,2-diyl)bis(3-phertylacrylate), (2E,2'E)-(1S,2S)-cyclohexane-1,2-diyl)bis(4-chlorophenylacrylate), (2E,2'E)-(1S,2S)-cyclohexane-1,2-diyl)bis(4-methoxyphenyl)acrylate). (2E,2'E)-N,N'-((1S,2S)-cyclohexane-1,2-diyl)bis(3-phenyl)acrylamide (2E,2'E)-N,N'-(1S,2S)-cyclohexane-1,2-diyl)bis(3-(4-chlorophenyl)acrylamide), (2E,2'E)-N,N'-((1S,2S)-cyclohexane-1,2-diaryl)bis(3-(4-methoxyphenyl)acrylamide, and combinations thereof.

In some embodiments, the reactant is dispersed in the non-photopolymer polymer matrix. In some embodiments, the reactant may be substantially uniformly dispersed in the polymer matrix. In some other embodiments, the reactant is bonded to the polymer matrix. In some embodiments, reactant may be covalently attached, or otherwise associated with, the polymer matrix. For example, in some embodiments, polymers functionalized with stilbenes or cinnamates (for example, poly vinyl cinnamates) may be utilized as the polymer matrix.

The thermoplastic polymer matrix may include a linear, branched or cross-linked polymer or co-polymer. Any polymer may be used so long as the sensitizer and reactant may be substantially uniformly dispersed therein or alternatively the reactant may be easily bonded thereto. Further, any polymer utilized may desirably not substantially interfere with the upper triplet energy transfer process. The polymer matrix may desirably include a polymer that is optically transparent, or at least has a high transparency at the wavelength contemplated for recording and reading the optical data storage medium. In certain embodiments, the optical storage media includes a non-photopolymer thermoplastic polymer matrix. The term "non-photopolymer" polymer matrix as used herein means that the recording of data in the optical storage media is not initiated by photo polymerization reaction of the monomers.

As noted earlier, the refractive index change within the optical storage medium is affected by formation of reactant from the product. This is in contrast to photopolymer-based optical data storage media, where the media is recorded onto by photo-initiated polymerization of a monomer. Accordingly, the dimensional changes accompanying recording of data may be lower than those associated with recording of data using photopolymers. Further, the non-photopolymer polymer matrix-based optical data storage medium of the present invention advantageously provide tier a stable, substantially-rigid media, which is in contrast to the gel-like photopolymer-based media.

Particular examples of suitable polymers for use in the polymer matrix include, but are not limited to, poly(alkyl methacrylates), such as poly(methyl methacrylate) (PMMA), polyvinyl alcohols, poly(alkyl acrylates), polystyrenes, polycarbonates, polyacrylates, poly(vinylidene chloride), poly (vinyl acetate), and combinations thereof. As mentioned above, the reactant may also be covalently attached, or otherwise associated with, the polymer matrix. In some embodiments, the polymer matrix may include poly vinyl cinnamates, wherein the cinnamate moiety may also function as a reactant.

Generally speaking, the optical data storage media described herein can be prepared by blending the desired sensitizer, reactant, mediator (if desired) and polymer matrix. Proportions of these may vary over a wide range, and the optimum proportions and methods of blending may be readily determined by those of ordinary skill in the art.

The amount of non-linear sensitizer used in the optical data storage media may depend on its optical density at the wavelength of light used to record the hologram. Solubility of the sensitizer may also be a factor. In one embodiment, the non-linear sensitizer is present in an amount of from about 0.001 weight percent to about 15 weight percent of the optical data storage media. In another embodiment, the non-linear sensitizer is present in an amount of from about 0.01 weight percent to about 10 weight percent of the optical data storage medium. In yet another embodiment, the non-linear sensitizer is present in an amount of from about 0.1 weight percent to about 10 weight percent of the optical data storage medium.

The reactant may be present in relatively high concentrations to yield large changes in optical properties within the polymer matrix. In one embodiment, the reactant is present in the optical data storage media in an amount in a range from about 5 weight percent to about 95 weight percent of the optical data storage medium. In another embodiment, the reactant is present in the optical data storage media in an amount in a range from about 10 weight percent to about 90 weight percent of the optical data storage medium. In yet another embodiment, the reactant is present in the optical data storage media in an amount in a range from about 20 weight percent to about 80 weight percent of the optical data storage medium.

In one embodiment, the optical data storage medium further includes a mediator capable of transferring triplet energy from the non-linear sensitizer to the reactant. In one embodiment, the triplet state of the mediator is desirably (a) below the triplet state ($T_n$; n>1) of the sensitizer but above the $T_1$ of the sensitizer and (b) above the triplet state ($T_1$) of the reactant, or between about 55 kilocalories per mole to about 90 kilocalories per mole. In one embodiment, if the mediator is dispersed within the polymer matrix the mediator may be present in an amount in a range from about 1 weight percent to about 20 weight percent in the polymer matrix.

Examples of suitable mediators include, but are not limited to, acetophenone ($T_{1m}\approx78$ kcal/mol), dimethylphthalate ($T_{1m}\approx73$ kcal/mol), propiophenone ($T_{1m}\approx72.8$ kcal/mot), isobutyrophenone ($T_{1m}\approx71.9$ kcal/mol), cyclopropylphenylketone ($T_{1m}\approx71.7$ kcal/mol), deoxybenzoin ($T_{1m}\approx71.7$ kcal/mol), carbazole ($T_{1m}\approx69.76$ kcal/mol), diphenyleneoxide ($T_{1m}\approx69.76$ kcal/mol), dibenzothiophene ($T_{1m}\approx69.5$ kcal/mol), 2-dibenzoylbenzene ($T_{1m}\approx68.57$ kcal/mol), benzophenone ($T_{1m}\approx68$ kcal/mol), polyvinylbenzophenone ($T_{1m}\approx68$ kcal/mop, 1,4-diacetylbenzene ($T_{1m}\approx67.38$ kcal/mol), 9H-fluorene ($T_{1m}\approx67$ kcal/mol), triacetylbenzene ($T_{1m}\approx65.7$ kcal/mol), thioxanthone ($T_{1m}\approx65.2$ kcal/mol), biphenyl ($T_{1m}\approx65$ kcal/mol), phenanthrene ($T_{1m}\approx62$ kcal/mol), phenanthrene ($T_{1m}\approx61.9$ kcal/mol), flavone ($T_{1m}\approx61.9$ kcal/mol), 1-napthonirile ($T_{1m}\approx57.2$ kcal/mol), poly (naphthoylstyrene) ($T_{1m}\approx55.7$ kcal/mol), fluorenone ($T_{1m}\approx55$ kcal/mol), and combinations thereof. In one embodiment, the medium is substantially free of the mediator.

The optical data storage media described herein may be in a se supporting form. Alternatively, the data storage media may be coated onto a support material, such as polymethylmethacrylate (PMMA), polycarbonate, poly(ethylene terephthalate), poly(ethylene naphthalate), polystyrene, or cellulose acetate. Inorganic support materials such as glass, quartz or silicon may also be used in embodiments wherein use of a support material may be desired.

In such embodiments, the surface of the support material may be treated in order to improve the adhesion of the optical data storage media to the support. For example, the surface of the support material may be treated by corona discharge prior to applying the optical data storage media. Alternatively, an undercoating, such as a halogenated phenol or partially hydrolyzed vinyl chloride-vinyl acetate copolymer may be applied to the support material to increase the adhesion of the storage media thereto.

As noted earlier, the optical storage media in accordance with embodiments of the invention advantageously allow for bit-wise recording of microholographic holographic data at 405 nm. The non-linear sensitizers used in the present optical data storage media are capable of transferring energy from an upper triplet state ($T_n$, wherein n>1), which has a very short lifetime (nanoseconds to a few μ (micro) seconds) to the reactant. The ability to transfer energy from the $T_n$, state provides the optical storage media provided herein with its non-linear or threshold properties. That is, $T_n$ excited state absorption is only appreciable when the sensitizer is excited by high-intensity light, and negligibly small when excited by low-energy radiation. This allows for the present optical data storage media, including the non-linear sensitizers, to remain substantially transparent and inert to low intensity radiation, e.g., reading or ambient light, and to only change its properties (absorbance and thus, refractive index) in response to high energy recording light, e.g., light having an intensity at least 2 orders of magnitude or more greater than readout light. As a result, the present optical data storage media exhibits the non-linear threshold behavior desired for the bit-wise recordation of microholographic data.

In some embodiments, the optical data storage medium is capable of recording the microhologram at 405 nm when an intensity of the incident radiation is greater than a threshold value. In some embodiments, the optical data storage medium is substantially non-responsive to the incident radiation at 405 nm when the intensity of the incident radiation is lower than the threshold value. The term "substantially non-responsive" as used in this context means that significant amount of data is not written on the optical storage medium at 405 nm if the intensity of the incident radiation is less than a threshold value.

Figure 2:
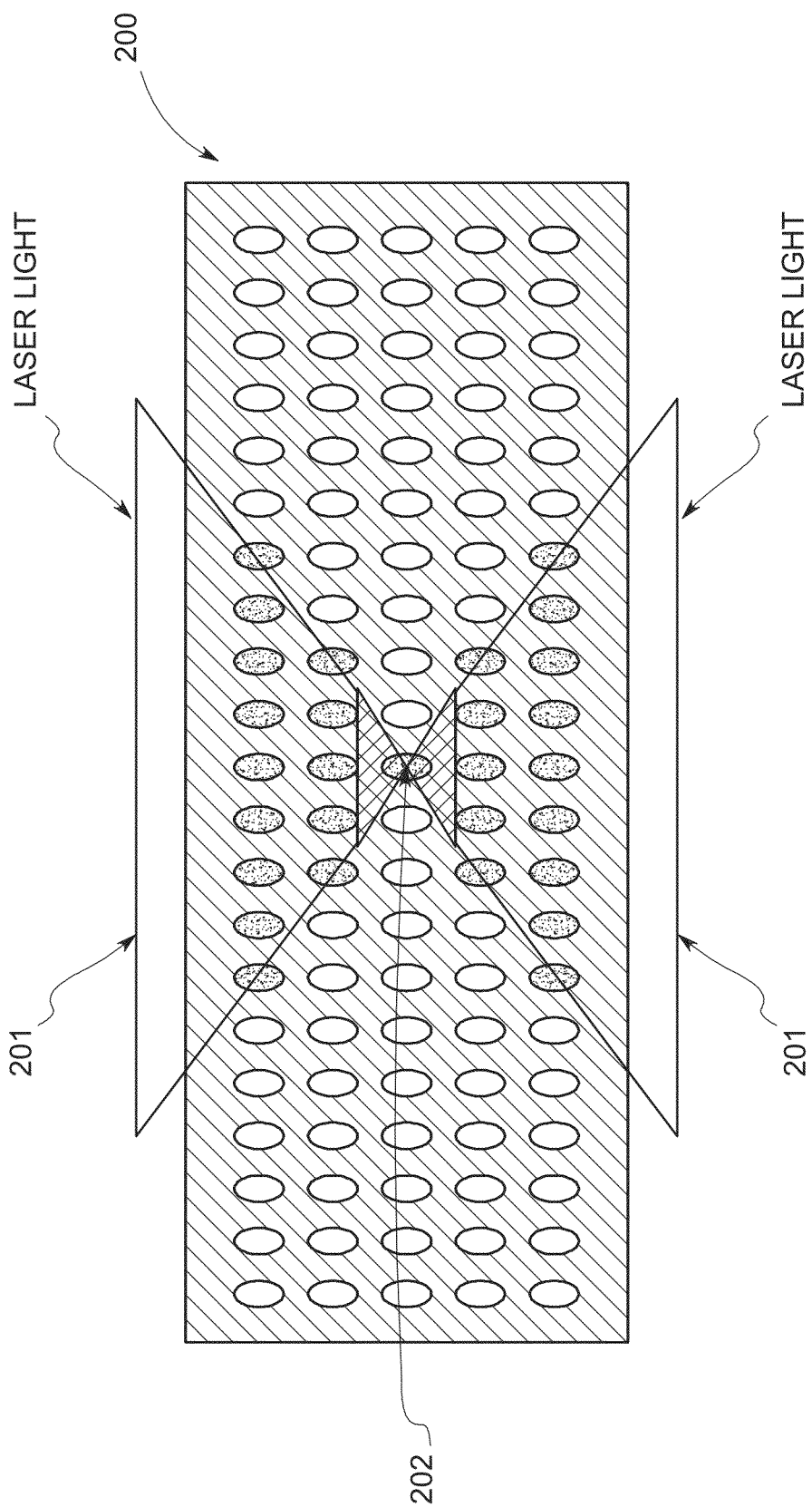
FIG. 2 is a cross-sectional view of an optical storage media, showing the area of impact of incident radiation if the media includes a linear sensitizer and the area of impact of incident radiation if the media includes a threshold sensitizer.

Further, the optical storage media allows for recording of microholographic data in multiple layers without affecting the data in the other layers during the writing and/or reading step. This is in contrast to media include linear photosensitive materials. As shown in FIG. 2, in optical data storage media 200 comprising linear photosensitive materials, consumption of dynamic range may occur in non-addressed volumes, substantially everywhere incident radiation passes through, shown as sections 201. In contrast, if optical data storage media 200 includes non-linear sensitizers, consumption of dynamic range in non-addressed volumes is reduced or eliminated and consumption may occur substantially only in the target volume, i.e., at the focal point 202 of the incident radiation. The use of non-linear sensitizers in the present optical data storage medium thus facilitates recording into a layer of bit-wise data buried in the bulk of the medium without disruption of adjacent layers of previously recorded data or vacant space available for subsequent recording.

Furthermore, as the light intensity in a tightly focused laser beam varies dramatically through the depth of the focal spot and is usually at its maximum at the beam waist (narrowest cross section), the threshold response of the medium will naturally restrict material conversion to occur only in the immediate vicinity of the beam waist. This may lead to a reduction in microhologram size within each layer, thus facilitating an increase in layer data storage capacity of the present media, so that the overall data storage capacity of the media may also be increased. The optical data storage media in accordance with some embodiments of the invention may also advantageously be substantially stable in ambient light, so that exposure to the same does not result in substantial deterioration or damage to the media.

In some embodiments, an optical data storage media is provided that exhibits refractive index changes (Δn) suitable for the recordation of microholograms at high data densities, e.g., refractive index changes of at least about 0.005, or at least about 0.05. Because of the refractive index change/diffraction efficiencies achievable by the present optical data storage media, the media may be capable of storing about 1 TB of information on a disk comparable in size to a single CD or single DVD.

EXAMPLES

Example 1

Synthesis of Platinum-Ethynyl Complexes

Starting Chemicals: Potassium tetrachloroplatinate, tri-n-butylphosphine, CuI, phenylacetylene, 4-iodo-(trimethylsilylethynyl)benzene, dichlorobis(triphenylphosphine)palladium(II), diethylamine, 4-ethynyl biphenyl, 4-ethynyl-1-anisole were purchased (all from Aldrich) were used as received.

Cis-PtCl$_2$(PBu$_3$)$_2$ (3)

Potassium tetrachloroplatinate (5.063 g, 12.197 mmol) and water (60 g, 3.33 mol) were added to a 250-mL, 3-neck round bottom flask. A solution of tri-n-butylphosphine (5.148 g, 25.44 mmol) dissolved in 100 mL of dichloromethane (134.1 g, 1.56 mol) was poured into the aqueous solution. Two phases firmed and after 5 minutes, the organic layer developed a light salmon pink, color as the product is formed. The mixture was vigorously stirred overnight with an overhead stirrer. The salmon-pink organic layer was collected using a separatory funnel and the aqueous layer further extracted with dichloromethane. The combined organic samples were concentrated, giving 8.061 g, (99%) product as a light yellow solid as a mixture of cis and trans isomers: $^1$H NMR (C$_6$D$_6$) δ: 2.01 (m, 12H), 1.72 (m, 12H), 1.49 (m, 12H), 1.02-0.91 (m, 18H). $^{13}$C{$^1$H} NMR (C$_6$D$_6$) 26.03, 24.37, 20.67, 13.76. $^{31}$P (CDCl$_3$) 2.06-cis.

Depending on the time of reaction and workup procedure, all cis or a mixture of cis and trans isomers were obtained and could be the ratio determined using $^{31}$P and/or $^{195}$Pt NMR spectroscopy. Thermal isomerization of cis→trans was reported to occur above its melting point (144° C.).[6] However, it was found during subsequent experiments that coupling reactions of 3 or 4 with terminal acetylenes produced the thermodynamically more stable trans compound from any cis isomer in the starting material.

Figure 4:
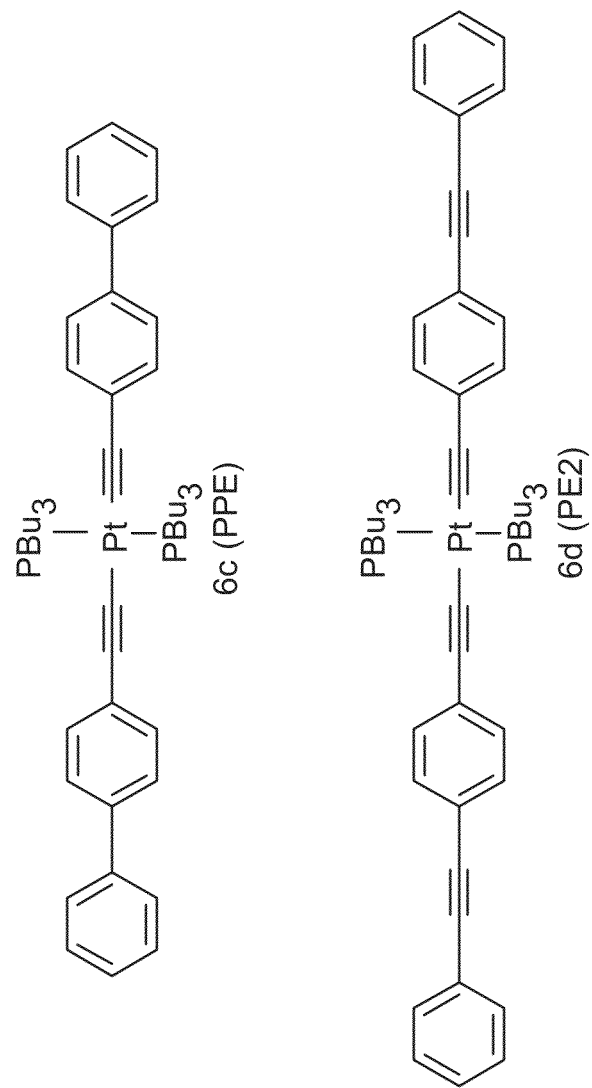
FIG. 4 shows the chemical formulae of certain platinum-ethynyl complexes (PPE and PE2) useful in the media and methods described herein.

FIG. 4 shows the base structure for the two classes of Platinum compounds prepared for evaluation. Each of these specific molecules listed below also had an acronym used as an identifier. These are shown below the structures and have been commonly used in the literature. The naming protocol for 6c is for a pair of PhenylPhenylEthynyl (PPE) groups and PE2 is from pairs of two-Phenylethynyl moieties.

Figure 5:
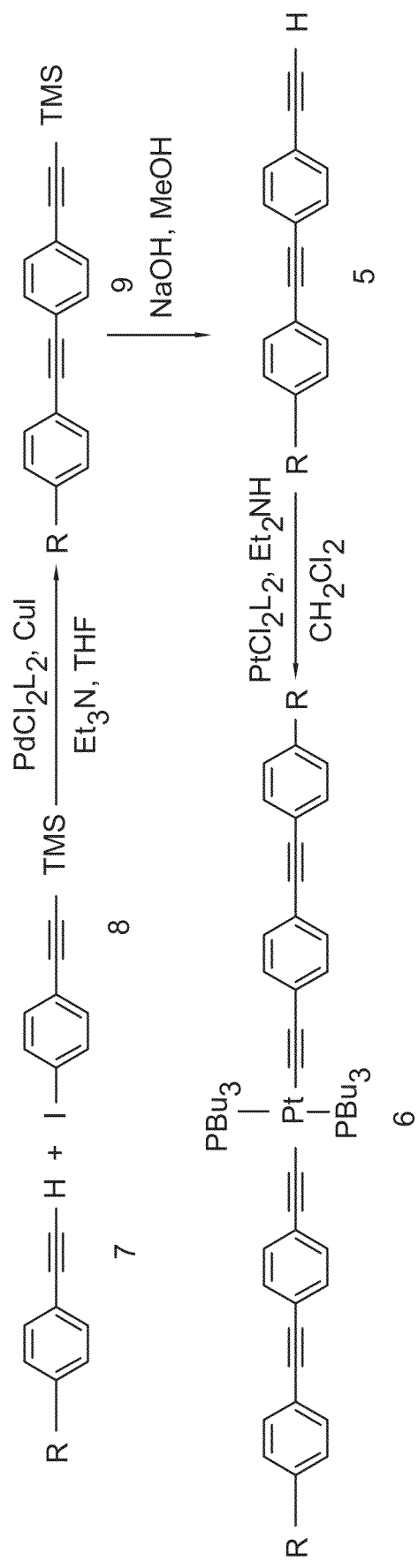
FIG. 5 is a flowchart of the synthesis of a platinum-ethynyl complex PE2) useful in the present media and methods.

In addition to the basic PE2 compound, a series of substituted PE2's were prepared. The overall 3-step process is shown in FIG. 5. Experimental is provided for compounds prepared having the following R groups in the para-position: Hydrogen (PE2), Flourine (F-PE2), n-butyl (n-Bu-PE2), methoxy (MeO-PE2), methyl (Me-PE2), and dimethylamino (DMA-PE2). Additionally, not depicted in the Figure is a 3,5-dimethoxy analog. The synthesis proceeded as follows. Dehydrohalogenation and C—C bond formation between 7 and 8 readily gave dialkyne 9 in good yields. Deprotection of the silyl group was followed by Palladium catalyzed reaction to give the desired platinum compounds (6).

Bis(1-ethynyl-4-(4-biphenylethynyl)benzene)bis(tri-n-butyl)phosphine)Pt (II) (PPE) (6c)

trans-dichlorobis(tri-n-butylphosphine) platinum (11) (1.761 g, 2.626 mmol) was added to a 3-neck, round bottom flask (100 mL), followed by CuI (0.005 g, 0.026 mmol), 4-ethynyl biphenyl (1.001 g, 5.616 mmol) and diethylamine (65 mL, 592 mmol). The yellow solution was stirred overnight under $N_2$. The solvent was evaporated leaving behind a yellow solid that was redissolved in hexanes/benzene and filtered through alumina (hexanes/benzene (1:0). After evaporating the solvent, bright yellow crystals were obtained. (1.878 g, 75%). $^1$H NMR (CDCl$_3$) δ: 7.61 (d, J=7.3 Hz, 4H), 7.49 (d, J=7.3 Hz, 4H), 7.44 (t, J=7.8 Hz, 4H), 7.37 (m, 6H), 2.19 (m, 12H), 1.66 (m, 12H), 1.49 (m, 12H), 0.97 (t, J=7.1 Hz, 18H).

(4-phenylethynyl)trimethylsilylethynylbenzene (9)

In a 500-mL Morton round bottom flask, 4-iodo-(trimethylsilylethynyl)benzene, 8, (2.19 g, 7.29 mmol) was added, followed by CuI (0.13 g, 0.67 mmol), dichlorobis(triphenylphosphine)palladium (II) (0.089 g, 0.13 mmol.) and 100 mL of triethylamine. The reaction was stirred under $N_2$, while the temperature was increased to reflux. A solution of phenylacetylene, 7, in triethylamine (10 mL) was added dropwise and the solution changed from a translucent, transparent yellow to a dark green. After 3 days, the reaction mixture was cooled to ambient temperature and a mixture of dichloromethane and hexanes was added to the reaction flask. The mixture was filtered through Celite™, then washed with saturated NH$_4$Cl. The aqueous layer was extracted with dichloromethane and the organic layers combined, dried over MgSO$_4$ and concentrated in vacuo. The crude product was purified by column chromatography (SiO$_2$/hexanes) giving a golden yellow powder. (1.915 g, 95%). $^1$H NMR (CDCl$_3$) δ: 7.56 (m, 2H), 7.48 (m, 4H), 7.37 (m. 3H), 0.28 (s, 9H).

(4-phenylethynyl)ethynylbenzene (4-phenylethynyl)trimethylsilyl-ethynylbenzene (0.999 g, 3.64 mmol) was dissolved in methanol (90 mL) to which 10 mL of 1N aqueous NaOH solution was added and stirred at room temperature.[8] After 45 minutes, the solvent was evaporated, 10 mL of 1N HCl was added and then the mixture was extracted with 60 mL of dichloromethane, washed with water (2×) and dried over MgSO$_4$. The solvent was removed in vacuo, leaving an orange brown solid behind. The crude product was purified by flash chromatography (SiO$_2$/hexanes to give a white solid (0.444 g) in 68% yield. $^1$H NMR (CDCl$_3$) δ: 7.56 (m, 2H), 7.50 (m, 4H), 7.37 (m, 3H), 3.20 (s, 1H).

Bis(1-ethynyl-4-(phenylethynyl)benzene)bis(tri-n-butyl)phosphine)Pt (PE2)

1-ethynyl-4-(phenylethynyl)benzene (1.39 g, 6.9 mmol) and trans-dichlorobis(tri-n-butylphosphine) platinum (II) (2.31 g, 3.45 mmol) were added to a 250 mL, 3-neck round bottom flask followed by CuI (25 mg, 0.13 mmol), and diethylamine (75 mL). The mixture was stirred at ambient temperature overnight under $N_2$ followed by filtration and concentration to give a yellow solid. The solid was recrystallized from EtOAc to give 0.61 g (18%) product isolated as a yellow solid. $^1$H NMR (CDCl$_3$) δ: 7.53 (m, 4H), 7.40 (m, 10H), 7.26 (t, J=8.2 Hz, 4H), 2.115 (m, 12H), 1.64 (m, 12H), 1.49 (m, 12H), 0.95 (t, J=7.3 Hz, 18H), $^{13}$C{$^1$H} NMR (CDCl$_3$): 131.5, 131.2, 130.7, 129.1, 128.3, 123.6, 119.2, 111.8, 109.4, 90.0, 89.8, 26.4, 24.4 (t, J=7.3 Hz), 24.0 (t, J=17.2 Hz) ppm.

1-(trimethylsilylothynyl)-4-(4-fluorophenylethynyl)benzene 4-iodophenytrimethyl silylacetylene (2.6 g, 8.7 mmol), 4-fluorophenylacetylene (1.07 g, 8.8 mmol), CuI (18 mg, 0.09 mmol), bis(triphenylphosphine)palladium(II)dichloride (0.18 g, 0.26 mmol), triethylamine (20 MO and THF (25 mL) were added together and stirred at ambient temperature under $N_2$ for 20 h. The reaction mixture was filtered to remove solids, washed with THF (10 mL), and concentrated to dryness. The crude product was recrystallized from hexanes to give 2.22 g (87%) product. mp 144-146° C. $^1$H NMR (CDCl$_3$) δ: 7.54 (m, 2H), 7.46 (m, 4H), 7.07 (mt, J=8.6 Hz, 2H), 0.28 (s, 9H). $^{13}$C{$^1$H}NMR (CDCl$_3$), 162.6 (J=249.6 Hz), 133.5 (J=8.1 Hz), 131.9, 131.3, 123.1, 123.0, 119.1 (1=3.6 Hz), 115.7 (J=22.0 Hz), 104.6, 96.3, 90.2, 88.7, −0.1 ppm.

1-ethynyl-4-(4-fluorophenylethynyl)benzene 1-(trimethylsilylethynyl)-4-(4-fluorophenylethynyl)benzene (2.2 g, 7.5 mmol) was dissolved in CH$_2$Cl$_2$ (30 mL) diluted with MeOH (30 mL) and then treated with powdered K$_2$CO$_3$ (2.1 g, 15 mmol) and allowed to stir at ambient temperature for 20 h under $N_2$. The reaction mixture was filtered to remove solids, concentrated, redissolved in CH$_2$Cl$_2$, washed with water (2×), brine, dried over MgSO$_4$, filtered and concentrated to dryness to give 1.43 g (87%) product that was used as is in the next reaction. $^1$H NMR, (CDCl$_3$) δ: 7.54 (m, 2H), 7.49 (m, 4H); 7.05 (t, J=8.4 Hz, 2H); 3.20 (s, 1H). $^{13}$C{$^1$H} NMR (CDCl$_3$): 162.6 (J=250.3 Hz), 133.6 (J=8.0 Hz), 132.1, 131.4, 123.6, 122.0, 119.1 (J=3.6 Hz), 115.7 (J=32.0 Hz), 90.3, 88.6, 83.3, 79.0 ppm.

Bis(1-ethynyl-4-(4-fluorophenylethynyl)benzene)bis(tri-n-butyl)phosphine)Pt(II) (F-PE2)

1-ethynyl-4-(4-fluorophenylethynyl)benzene (1.4 g, 6.35 mmol) and trans-dichlorobis(tri-n-butylphosphine) platinum (11) (2.13 g, 3.18 mmol) were added together, followed by CuI (25 mg, 0.13 mmol), and diethylamine (70 mL). The mixture was stirred at ambient temperature for 45 h under $N_2$ during which time a solid formed. followed by filtration and concentration to give a solid. The solid was removed by filtration and the filtrate concentrated, redissolved in CHCl$_3$, washed with water (2×), brine, dried with MgSO$_4$, filtered, concentrated and the solid recrystallized from EtOAc. The original solid was also found to be product. Total yield of product from EtOAc was 1.30 g (79%). mp 149-151° C. $^1$H NMR (CDCl$_3$) δ: 7.51 (m, 4H); 7.39 (m, 4H); 7.25 (d, J=8.1 Hz, 4H); 7.08 (m, 4H); 2.1 (m, 12H); 1.63 (m, 12H); 1.48 (m, 12H), 0.95 (t, J=7.2 Hz, 18H). $^{13}$C {$^1$H} NMR (CDCl$_3$): 162.4 (J=249 Hz), 133.6 (1=8.0 Hz), 131.34, 131.18, 130.95, 130.71, 129.2, 119.4 (J=67 Hz), 115.7 (J=22 Hz), 111.9, 109.3, 89.7, 88.7, 26.7, 24.4 (J=7.6 Hz), 23.96 (J=17.6), 13.8 ppm.

1-(trimethylsilylethynyl)-4-(4-n-butylphenylethynyl) benzene 4-iodophenytrimethyl silylacetylene (5.0 g, 16.6 mmol), 4-n-butylphenylacetylene (2.67 g, 16.0 mmol), CuI (32 mg, 0.16 mmol), bis(triphenylphosphine)palladium(II)dichloride (0.35 g, 0.48 mmol), triethylamine (50 mL) and THF (50 mL) were added together and stirred at ambient temperature under $N_2$ for 18 h. The reaction mixture was filtered to remove solids and concentrated to dryness, redissolved in $CHCl_3$, washed with water (2×), brine, dried with $MgSO_4$, filtered, concentrated and the solid recrystallized from hexanes to give 2.10 g (40%) product. The crude product could also be purified by washing with MeOH. This gave 1.94 g additional product for a total yield of 79%. $^1H$ NMR ($CDCl_3$) δ: 7.46 (m, 6H), 7.20 (d, J=8.11 Hz, 2H); 2.63 (t, J=7.6 Hz, 2H); 1.62 (m, 2H); 1.38 (m, 2H); 0.95 (t, J=7.2 Hz, 3H); 0.28 (s, 9H). $^{13}C\{^1H\}$ NMR ($CDCl_3$): 143.7, 131.9, 131.6, 131.3, 128.5, 123.6, 122.7, 120.1, 104.7, 96.1, 91.6, 88.4, 35.6, 33.4, 22.3, 14.0, −0.1 ppm.

1-ethynyl-4-(4-n-butylphenylethynyl)benzene 1-(trimethylsilylethynyl)-4-(4-n-butylphenylethynyl)benzene (192 g, 11.86 mmol) was dissolved in $CH_2Cl_2$ (100 nit) diluted with MeOH (40 mL) and then treated with powdered $K_2CO_3$ (2.1 g, 15 mmol) and allowed to stir at ambient temperature for 19 h under $N_2$. The reaction mixture was filtered to remove solids, concentrated, redissolved in $CHCl_3$, washed with water (2×), brine, dried over $MgSO_4$, filtered and concentrated to dryness to give a brown solid. The solid was chromatographed on silica gel, eluting with 15:1 hexanes/EtOAc to give several fractions rich in product. These fractions were combined and chromatographed again with 95:5 hexanes/EtOAc to give 0.25 g (7%) product as a waxy solid. $^1H$ NMR ($CDCl_3$) δ: 7.50 (s, 4H), 7.47 (d, 8.2 Hz, 2H); 7.21 (d, J=8.2 Hz, 2H); 3.20 (s, 1H); 2.63 (t, J=7.8 Hz, 2H); 1.64 (m, 2H); 1.41 (m, 2H); 0.97 (t, J=7.5 Hz, 3H). $^{13}C\{^1H\}$ NMR ($CDCl_3$): 143.8, 132.1, 11.6, 131.4, 1128.6, 124.1, 121.6, 120.0, 911.7, 88.2, 83.4, 78.8, 35.6, 33.4, 22.2, 14.0 ppm.

Bis(1-ethynyl-4-(4-n-butylphenylethynyl)benzene) bis(tri-n-butyl)phosphine)Pt(II)(n-Bu-PE2)

1-ethynyl-4-(4-n-butylphenylethynyl)benzene (0.24 g, 0.81 mmol) and trans-dichlorobis(tri-n-butylphosphine) platinum (II) (0.27 g, 0.41 mmol) were added together, followed by CuI (10 mg), and diethylamine (20 mL). The mixture was stirred at ambient temperature for 70 h under nitrogen. The reaction was concentrated and azeotroped twice with methanol. The residue was dissolved in 2:1 Hexane/$CH_2Cl_2$ and washed 3 times with water. The final water wash was neutral pH. The solution was concentrated and the product recrystallized from EtOAc/MeOH. The solvent was removed and the crystals were washed 3 times with 2:1 MeOH/EtOAc. After drying, 164 mg (35%) of a light brown product was obtained. $^1H$ NMR ($CDCl_3$) δ: 7.44 (d, 4H); 7.38 (d, 4H); 7.2.4 (d, 4H); 7.17 (d, 4H); 2.64 (3, 4H); 2.14 (m, 12H); 1.62 (m, 16H); 1.55-1.35 (16H); 0.96 (m, 24H)

1-(trimethylsilylethynyl)-4-(p-methoxyphenylethynyl)benzene

Into a 50 ml round bottom flask was placed a mixture of 0.72 g (0.0054 mole) of p-methoxyphenylacetylene, 1.51 g (0.005 mole) of 4-iodophenyltrimethylsilylacetylene, 0.0102 g (0.0053 mmole) of CuI, 0.102 g (0.146 mmole) of bis (triphenylphosphine)palladium(II)dichloride in 10 ml of THF and 10 ml of triethylamine. The light orange brown mixture was stirred at room temperature under nitrogen for 3 days. The reaction mixture was then filtered and the filtrate concentrated under reduced pressure. The residue was redissolved in 10 ml of chloroform and the solution was washed two times with water (10 ml each) and then dried over anhydrous $MgSO_4$, filtered and concentrated. 1.5 g (98.7% yield) of solid was obtained. $^1HNMR$: 0.28 ppm (s, 9H); 3.85 ppm (s, 3H); 6.90 ppm (d, 2H); 7.45 ppm (s, 4H); 7.48 ppm (d, 2H).

1-ethynyl-4-(p-methoxyphenylethynyl)benzene

Into a 100 ml round bottom flask was placed a mixture of 1.5 g (0.0049 mole) of 1-(trimethylsilylethynyl)-4-(p-methoxyphenylethynyl)benzene, 1.36 g (0.0098 mole) potassium carbonate, 20 ml of methanol and 20 ml of methylene chloride. The mixture was stirred at room temperature under nitrogen overnight. The dark brown suspension was filtered and the methylene chloride solution was washed twice with water (20 ml each). The aqueous layers were combined and extracted twice with methylene chloride (10 ml each). The organic layers were combined and dried over anhydrous $MgSO_4$, filtered and concentrated. 0.62 g (54.9% yield) of solid was obtained. $^1HNMR$ showed the desired product being the major component. This crude solid was carried on to the next step without purification.

Bis(1-ethynyl-4(p-methoxyphenylethynyl)benzene) bis(tri-nbutylphosphine)Pt(II) (MeO-PE2)

Into a 100 ml flask was charged with a mixture of 0.62 g (0.0027 mole) of 1-ethynyl-4-(p-methoxylphenylethynyl) benzene, 0.89 (0.00134 mole) of trans-dichloro-bis(tri-n-butylphosphine) platinum(II), 0.012 g (0.063 mmole) of CuI in 30 ml of diethylamine. The mixture was stirred overnight at room temp. The reaction mixture was filtered and the solid washed with methylene chloride. The filtrate was concentrated. A reddish brown oil was obtained. The crude product was purified by silica gel column chromatography. 0.49 g of pure component was obtained. Both $^1HNMR$ and MS indicated that the component was actually the chloro-(1-ethynyl-4(p-methoxyphenylethynyl)benzene)bis(tri-n-butylphosphine)Pt(II). The reaction did not proceed to completion.

1-(trimethylsilylethynyl)-4-(4-methylphenylethynyl) benzene

Into a 50 ml round bottom flask was placed a mixture of 0.64 g (0.0054 mole) of 4-methylphenylacetylene, 1.50 g (0.005 mole) of 4-iodophenyltrimethylsilylacetylene, 0.011 g (0.0058 mmole) of CuI, 0.103 g (0.146 mmole) of bis(triphenylphosphine)palladium(II)dichloride in 10 ml of THF and 10 ml of triethylamine. The brown solution turned to an orange-yellow suspension when solid started to form. The mixture was stirred at room temperature under nitrogen for 3 days. It was filtered and the filtrate concentrated under reduced pressure. The residue was redissolved in 25 ml of chloroform and the solution was washed two times with water (15 ml each) and then dried over anhydrous $MgSO_4$, filtered and concentrated, 1.43 g (quantitative yield) of solid was obtained. $^1HNMR$ indicated ~10% of by product present. The solid product was used for the next step without further purification.

1-ethynyl-4-(4-methylphenylethynyl)benzene

Into a 100 ml round bottom flask was placed a mixture of 1.43 g (0.005 mole) of 1-(trimethylsilylethynyl)-4-(4-methylphenylethynyl)benzene, 1.37 g (0.01 mole) potassium carbonate, 20 ml of methanol and 20 ml of methylene chloride. The mixture was stirred at room temperature under nitrogen overnight. The dark brown suspension was filtered and the filtrate was washed twice with water (20 ml each). The aqueous layers were combined and extracted twice with methylene chloride (10 ml each). The methylene chloride layers were combined and dried over anhydrous $MgSO_4$, filtered and concentrated. 0.7 g (73.1% yield) of brownish yellow solid was obtained. $^1$HNMR: 2.40 ppm (2, 3H); 3.19 ppm (s, 1H); 7.15-7.18 ppm (d, 2H); 7.43-7.46 ppm (d, 2H); 7.49 (s, 4H). The NMR indicated that there were some by-products present. It was used for the next step without further purification.

Bis(1-ethynyl-4(4-methylphenylethynyl)benzene)bis(tri-n-butylphosphine)Pt(II) (Me-PE2)

Into a 100 ml flask was charged with a mixture of 0.72 g (0.0033 mole) of 1-ethynyl-4-(4-methylphenylethynyl)benzene, 1.12 g (0.0017 mole) of trans-dichloro-bis(tri-n-butylphosphine) platinate(II), 0.014 g (0.074 mmole) of CuI in 45 ml of diethylamine. The muddy brown suspension was stirred overnight at room temp. The reaction mixture (dark yellow suspension) was filtered and the solid washed with methylene chloride. The filtrate was concentrated. 1.0 g of gummy reddish brown residue was obtained. The crude product was purified by recrystallization from ethyl acetate (10 ml). 0.21 g (12.3% yield) of yellow crystal was obtained. 1.9 ppm (m, 18H); 1.4-1.6 ppm (m, 24H); 2.0-2.2 ppm. (m, 12H); 2.40 ppm (*s, 6H); 7.14-7.44 ppm (aromatic, 16H); m.p. 11.44-148C.

1-(trimethylsilylethynyl)-4-(3,5-dimethoxyphenylethynyl)benzene

Into a 100 ml round bottom flask was placed a mixture of 1.31 g (0.0081 mole) of 3.5-dimethoxyphenylacetylene, 2.25 g (0.0075 mole) of 4-iodophenyl-trimethylsilylacetylene, 0.016 g (0.084 mmole) of CuI, 0.155 g (0.22 mmole) of bis(triphenylphosphine)palladium(II)dichloride in 15 ml of THF and 15 ml of triethylamine. The light brown solution turned to a suspension within a minute. After ~40 min, the reaction mixture turned to an orange solution with some white ppt. The reaction was followed by TLC. The mixture was stirred at room temperature under nitrogen overnight. TLC showed presence of staring material still. The reaction was stirred continuously overnight at room temp. Not much further reaction had occurred. It was then stirred overnight at 50° C. TLC indicated that only a trace of starting material was present. The reaction was then terminated and the reaction mixture was filtered and the filtrate concentrated under reduced pressure. The residue was redissolved in 15 ml of chloroform and the solution was washed two times with water (15 ml each) and dried over anhydrous $MgSO_4$, filtered and concentrated. 2.27 g (90.4% yield) of solid was obtained. $^{1H}$NMR: 0.26 ppm (s, 9H); 3.83 ppm (s, 6H); 6.49 ppm (s, 1H); 6.70 ppm (s, 2H); 7.47 ppm (s, 4H).

1-ethynyl-4-(3,5-dimethyoxyphenylethynyl)benzene

Into a 100 ml round bottom flask was placed a mixture of 2.27 g (0.0068 mole) of 1-(trimethylsilylethynyl)-4-(3,5-dimethoxyphenylethynyl)benzene, 1.88 g (0.0136 mole) potassium carbonate, 30 ml of methanol and 30 ml of methylene chloride. The mixture was stirred at room temperature overnight under nitrogen. The dark brown suspension was filtered through an alumina bed to remove some color, and the still dark color filtrate was washed twice with water (30 ml each). The aqueous layers were combined and extracted twice with methylene chloride (20 ml each). The methylene chloride layers were combined and dried over anhydrous $MgSO_4$, filtered and concentrated. 1.13 g of brown oil was obtained. The crude oil was purified by Preparative LC using 1:10 EtOAc:hexane as eluting solvent. 240 mg (13.5% yield) of yellow solid was obtained. $^1$HNMR 3.20 ppm (s, 1H); 3.83 ppm (s, 6H); 6.50 ppm (t, 1H); 6.71 ppm (d, 2H); 7.50 ppm (s, 4H).

Bis(1-ethynyl-4(3,5-dimethoxyphenylethynyl)benzene)bis(tri-n butylphosphine)Pt(II) (3,5-diMeO-PE2)

Into a 25 ml flask was charged with a mixture of 119.5 mg (0.456 mmole) of 1-ethynyl-4-(3,5-dimethoxyphenylethynyl)benzene, 0.152 g (0.228 mmole) of trans-dichloro-bis(tri-n-butylphosphine)platinate(II), 0.003 g (0.0157 mmole) of CuI in 7 ml of diethylamine. The reaction mixture was stirred at room temp and turned to a slightly greenish yellow cloudy mixture. Reaction was continued overnight at room temperature. NMR indicated the reaction was not completed. It was continuously stirred at room temperature for another 24 hours and NMR indicated the reaction didn't proceed any further. The reaction was then terminated. The reaction mixture was filtered and the solid washed with methylene chloride. The filtrate was concentrated. 240 mg of brown color semi-solid was obtained. The crude product was purified by Preparative LC using 1:4 EtOAc:hexanes as eluting solvent, and obtained 61 mg of pure white solid. $^1$HNMR: 0.95 ppm (t, 18H); 1.46-1.62 ppm (m, 24H); 2.1.4 ppm (m, 12H); 3.83 ppm (s, 12H); 6.47 ppm (t, 2H); 6.69 ppm (d, 4H); 7.23 ppm (d, 4H); 7.38 ppm (d, 4H).

1-(trimethylsilylethynyl)-4-(4-N,N-dimethylaminophenylethynyl)benzene

Into a 100 ml round bottom flask was placed a mixture of 1.17 g (0.0081 mole) of 4-N,N-dimethylaminophenylacetylene, 2.25 g (0.0075 mole) of 4-iodophenyl-trimethylsilylacetylene, 0.015 g (0.075 mimic) of CuI, 0.155 g (0.219 mmole) of bis(triphenylphosphine)-palladium(II)dichloride in 15 ml of THF and 15 ml of triethylamine. The light brown suspension was stirred overnight at room temperature. TLC indicated the presence of starting material. The reaction was continued for another 24 hours at room temperature and no further reaction was observed. It was then stirred at 50° C. overnight. TLC indicated that only a trace amount of starting material was present. The reaction was terminated and the reaction mixture was filtered. The filtrate was concentrated under reduced pressure. The residue was redissolved in 15 ml of chloroform and the solution was washed two times with water (15 ml each) and then dried over anhydrous $MgSO_4$, filtered and concentrated. 2.26 g (94.9% yield) of solid was obtained. $^1$HNMR: 0.28 ppm (s, 9H); 3.02 ppm (s, 6H); 6.69 ppm (d, 2H); 7.41 ppm (d, 2H); 7.44 ppm (s, 4H).

1-ethynyl-4-(4-N,N-dimethylaminophenylethynyl)benzene

Into a 100 ml round bottom flask was placed a mixture of 2.26 g (0.0071 mole) of 1-(trimethylsilylethynyl)-4-(4-N,N- dimethylaminophenylethynyl)benzene, 1.97 g (0.0143 mole) potassium carbonate, 30 ml of methanol and 30 ml of methylene chloride. The mixture was stirred at room temperature overnight under nitrogen. The dark brown suspension was filtered and the filtrate was washed twice with water (30 ml each). The aqueous layers were combined and extracted twice with methylene chloride (20 ml each). The methylene chloride layers were combined and dried over anhydrous $MgSO_4$, filtered and concentrated, 1.0 g of brownish yellow solid was obtained. The crude product was purified by Preparative LC. 280 mg of purified product was collected, it was further purified by recrystallization from EtOAc/hexanes yielding 112 mg (5.4% yield) of pure product. $^1$HNMR: 3.02 ppm (s, 6H); 3.17 ppm (s, 1H); 6.69 ppm (d, 2H); 7.41 ppm (d, 2H); 7.46 ppm (s, 4H).

Bis(1-ethynyl-4(4-N,N-dimethylaminophenylethynyl)benzene)bis(tri-n-butyl-phosphine)Pt(II) (DMA-PE2)

Into a 25 ml flask was charged with a mixture of 112 mg (0.457 mmole) of 1-ethynyl-4-(4-N,N-dimethylaminophenylethynyl)benzene, 0.152 g (0.227 mmole) of trans-dichloro-bis(tri-n-butylphosphine) platinate(II), 0.003 g (0.0157 mmole) of CuI in 7 ml of diethylamine. The yellow suspension was stirred overnight at room temperature. The reaction mixture was filtered and the filtrate was concentrated. 164 mg of dark yellow semi-solid was obtained. The crude product was purified by Preparative LC. 84 mg (33.7%) of pure product was obtained. $^1$HNMR: 0.96 ppm (t, 18H); 1.47 ppm (m, 24H); 2.03 ppm (m, 12H); 3.00 ppm (s, 12H); 6.68 ppm (d, 4H); 7.36 ppm (d, 8H); 7.40 ppm (d, 4H).

Example 2

Linear Optical Measurements

As mentioned above, minimal absorption at 405 nm is required for blue RSA dyes. UV-Vis spectra were taken of the platinum-ethynyl complexes prepared according to Example 1, and the absorptions were normalized by converting them to extinction coefficient as a function of the wavelength. The data from this example are summarized in Table 1.

TABLE 1

| Pt-Complex | $\lambda_{max}$/nm[b] | $\epsilon_{max}$/M$^{-1}$cm$^{-1}$[b] | $\epsilon_{405nm}$/M$^{-1}$cm$^{-1}$[c] |
|---|---|---|---|
| PE2 | 356 | 87561 | 51 |
| PPE | 331 | 75939 | 111 |

All measurements were conducted in benzene. [b]$\lambda_{max}$ and $\epsilon_{max}$ were measured in benzene for PPE and in chloroform for PE2. [c]The extinction coefficient at 405 nm was calculated using concentrated solutions ($\sim 10^{-2}$-$10^{-3}$ M).

Example 3

Non-Linear Optical Measurements

Nonlinear optical absorption experiments were employed to determine the non-linearity of the Pt-complexes. The measurements were done using a 5 ns pulsed tunable laser system operating at the 405 nm wavelength. Z-scan is one of the common nonlinear-optical techniques to asses non-linearity in material absorbance and has been documented in the literature (e.g. "Nonlinear Optics of Organic Molecules and Polymers", Edited by H. S. Nalwa and S. Miyata, CRC Press 1997). Briefly, Z-scan is a technique in which the sample is moved through a focused laser beam, causing the light intensity on sample to change, and changes in the sample's transmissivity are measured as a function of position. Alternatively, a sample may be subjected to a focused pulsed laser beam of variable power, and the transmissivity at the laser wavelength may be directly measured as a function of the light intensity (optical flux) of the incident radiation. Both approaches result in a dependence of the dye's transmissivity upon the incident light intensity, which constitutes its nonlinear optical response.

These dependencies are then analyzed to obtain two parameters that characterize the behavior of the platinum ethynyl complex: the threshold intensity ($I_{th}$)—the energy flux at which the nonlinear response "turns on," and the "k value"—the enhancement factor that describes the achievable ratio between the high- and low-intensity absorption cross-sections. These parameters define the range of optical power that can utilize the dye properties, and how efficient the reverse saturable absorption process is. The goal is to minimize the threshold value and maximize the k value.

The dye concentrations were chosen to achieve transmissivity around 0.8-0.9. Dichlorobenzene was used as a solvent and after mixing with the platinum ethynyl complexes, the solutions were filtered and placed in 1 mm cuvettes for Z-scan measurements.

Figure 6A:
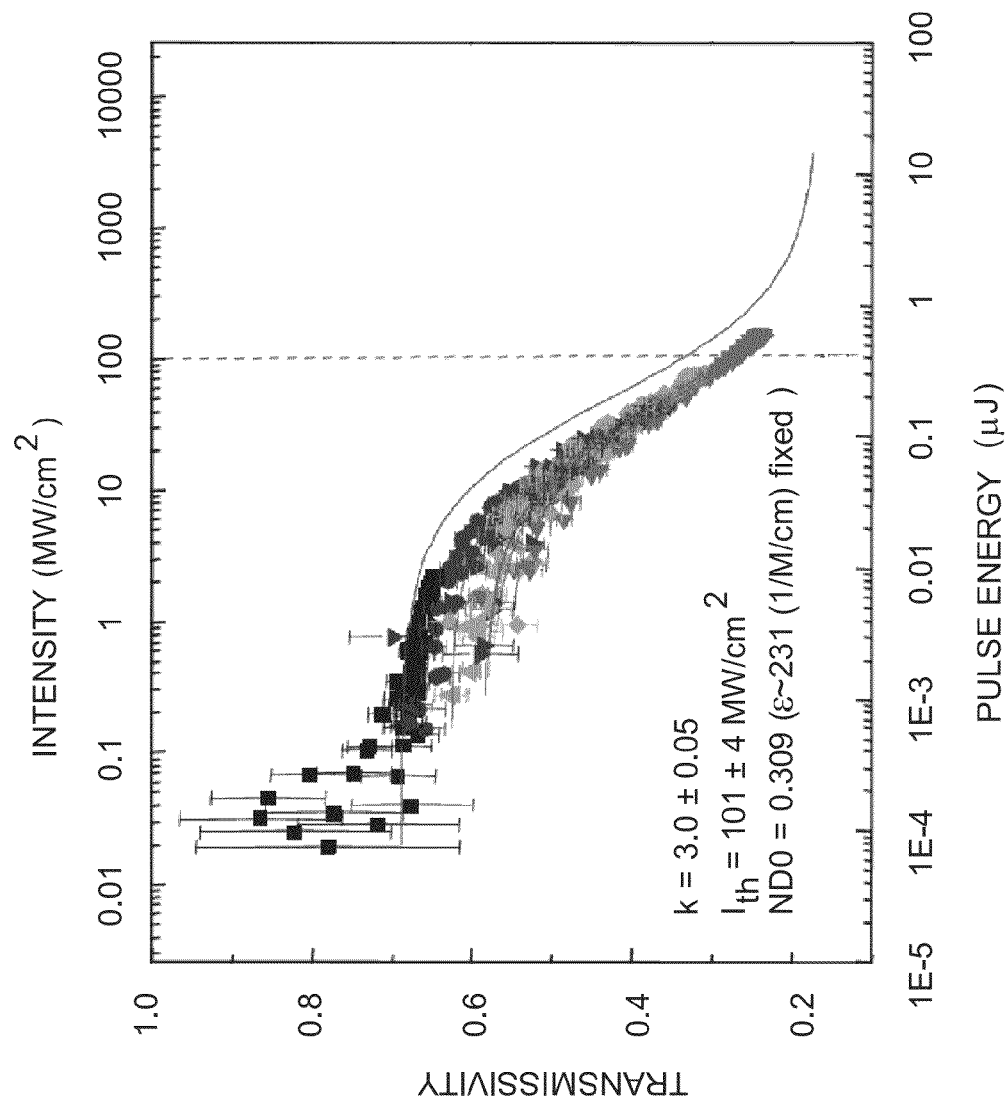
FIG. 6A is a graphical depiction of the Z-Scan measurements taken of a platinum-ethynyl complex (PE2) useful in the present media and methods.
Figure 6B:
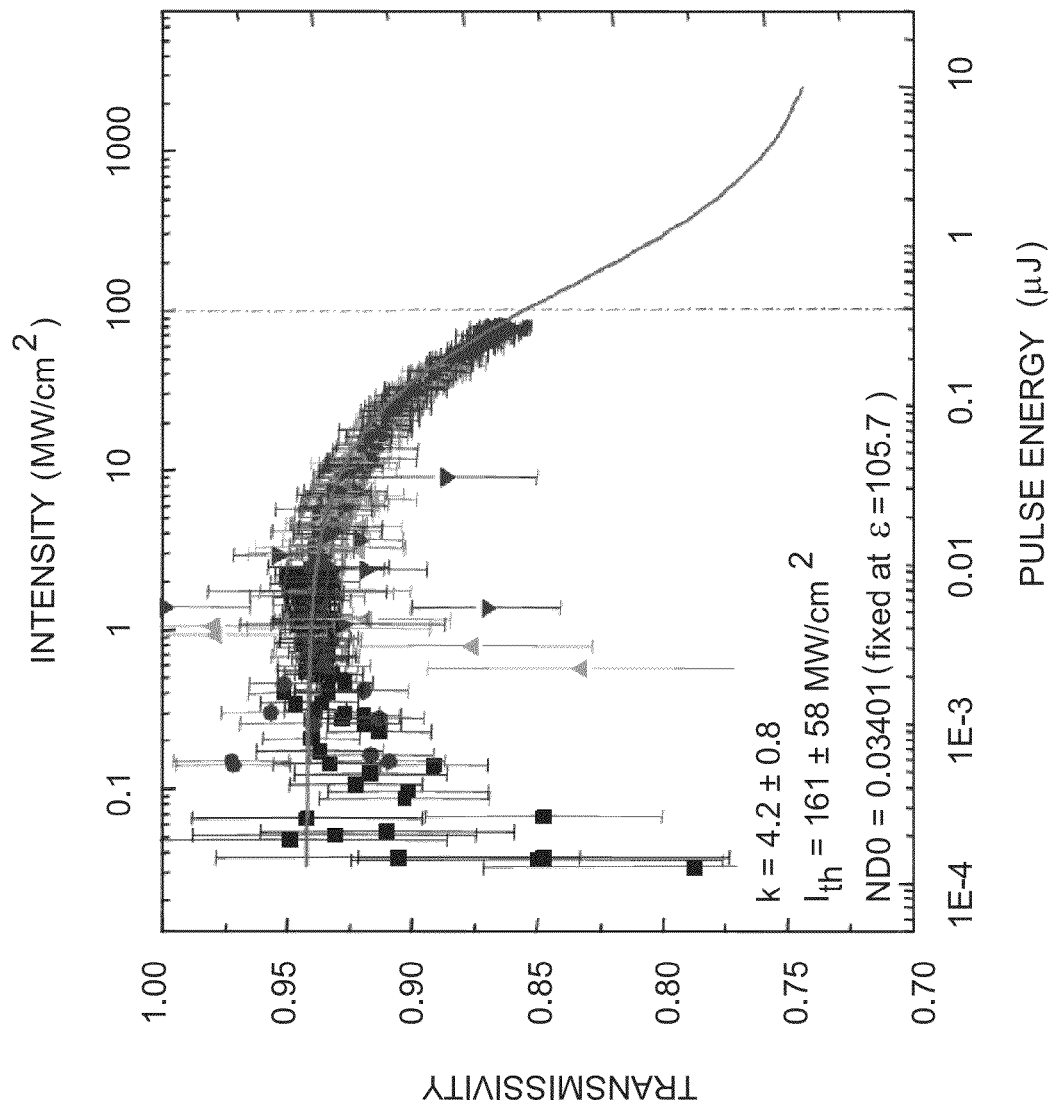
FIG. 6B is a graphical depiction of the Z-Scan measurements taken of a platinum-ethynyl complex (PPE) useful in the present media and methods.

FIGS. 6A-6B show the normalized transmission vs pulse energy data for PE2 (6A) and PPE (6B) dyes at varying laser intensities. These data were obtained from the dependence of normalized transmission against 1-position. As can be seen in these graphs, at tow pulse energies very low levels of the beam are absorbed and most of the light is transmitted through the sample. However, as the pulse energies increases, more and more of the light is absorbed and so the amount of light transmitted is less, demonstrating the nonlinear effect of the dye. Compounds that don't display RSA behavior would not display the drop in transmitted light at higher pulse energies. The multiple lines within each plot represent multiple experiments on the same individual compounds. Table 2 summarizes the data obtained from the Z-scan measurements.

TABLE 2

| | Extinction Coeff (@405 nm) 1/M/cm | $I_{th}$ | +/− dI | k | +/− dk |
|---|---|---|---|---|---|
| PE2 | 231.1 | 101 | 4 | 3 | 0.05 |
| PPE | 105.7 | 161 | 58 | 4.2 | 0.8 |

As shown in Table 2, PE2 and PPE showed non-linear properties with low k values. This meant that these dyes have a low enhancement of absorption cross-section. However the threshold intensity, above which the higher $T_n$, triplet states start to be excited, show reasonable energies of ~100 MW/cm$^2$, which are acceptable.

Example 3 shows that the platinum-ethynyl complexes studied exhibit sufficient non-linear optical properties to be considered as a key components for a u-hologram recording medium.

Examples 4-6

Microhologram Recording

Sample Preparation

Thin film samples for demonstrating microholograms and recording the reflectivity after writing microholograms were prepared as follows:

Example 4

Platinum Ethynyl/Stilbene/PMMA. Solution of PMMA (0.870 g) with trans-stilbene (80 mg), and 0.5 wt % of PPE (trans-Bis(tributylphosphine)bis(4-ethynylbiphenyl)platinum) will be prepared using dichloroethane/methylene chloride solvent mixture (15 g, 2:8 v/v) as solvent. The solution will be filtered using 0.45 μm filter, poured onto a glass rim (5 cm diameter) on a glass plate setup and dried on a hot plate maintained at about 45° C. for 5 hours and at about 75° C. overnight. After drying on a hot plate, the films will be removed from the glass plates and vacuum dried at 60° C. for 6 hours.

Example 5

Platinum Ethynyl/polyvinylcinnamate (PVCm). 1 g of PVCm containing 68 wt % cinnamate (MW 100,000) was dissolved in 1:1 dichloroethane/methylene chloride. 0.5 wt % of PPE (trans-Bis(tributylphosphine)bis(4-ethynylbiphenyl) platinum) was added and the materials dissolved by stirrer accompanied by heating on a hot plate maintained at 70° C. The solution was then filtered using a 0.450 mm syringe filter and the filtered solution poured into a glass rim (5 cm diameter) on a glass plate setup and dried on a hot plate maintained at 45° C. for 12 hours and at 75° C. overnight. After drying on a hot plate, the films were removed from the glass plates and dried in vacuum at 70° C. for 6 hours.

Example 6

Platinum Ethynyl/polyvinylcinnamate (PVCm). 1 g of PVCm containing 68 wt % cinnamate (MW 100,000) was dissolved in 1:1 dichloroethane/methylene chloride. 1.5 wt % of PE2 (trans-Bis(tributylphosphine)bis(4-ethynyl-1-(2-phenylethynyl)benzene)platinum) was added and the materials dissolved by stirrer accompanied by heating on a hot plate maintained at 70° C. The solution was then filtered using a 0.450 mm syringe filter and the filtered solution poured into a glass rim (5 cm diameter) on a glass plate setup and dried on a hot plate maintained at 45° C. for 12 hours and at 75° C. overnight. After drying on a hot plate, the films were removed from the glass plates and dried in vacuum at 70° C. for 6 hours.

Microhologram Recording

A tunable optical parametric oscillator system operating at the 405 nm wavelength was used as a pulsed light source for recording and readout of micro-holograms. The light was focused into the medium sample using optics with numerical aperture (NA) of 0.16, resulting in the approximate dimensions of the recording volume to be 1.6×1.6×17 μm. The pulse energies used for micro-hologram recording was between 10 s to 100 s of nano-Joules, which allowed one to achieve light intensity values of hundreds of MW/cm$^2$ to several GW/cm$^2$ at the focal spot of such focused recording beam. The readout of the light reflected from micro-holograms was done using the same beam attenuated by approximately 100-1000× with respect to the recording power.

The recording of μ-holograms in the optical data storage media was performed by two high-intensity counter-propagating pulsed recording beams focused and overlapped in the bulk of the recording medium to produce the intensity fringe pattern consisting of light and dark regions (fringes). The illuminated regions of the interference pattern undergo a change as described above, which results in a locally modified refractive index of the material, while the dark regions remain intact, thus creating a volume hologram. The present threshold optical data storage media is sensitive to a high-intensity light and is relatively inert to the low-intensity radiation. The power of the recording beam was adjusted so that the light intensity near the focal region of the beam is above the recording threshold (above which the change readily occurs), while remaining low outside the recordable region away from the focal spot of the beam, thus eliminating unintended media modification (recording or erasure).

During μ-hologram recording, the primary recording beam was split into the signal and the reference using a half-wave plate (λ/2) and a first polarization beam splitter. The two secondary beams were steered to the sample in a counter-propagating geometry and are focused to overlap in the bulk of the optical data storage media by identical aspheric lenses with a numerical aperture (NA) of up to 0.4. The polarization of both beams was converted into circular polarization—with two quarter-wave plates (λ/4) to ensure that the beams interfere to create a high-contrast fringe pattern. The sample and the signal beam lens were mounted on closed-loop three-axis positioning stages with 25 nm resolution. A position-sensitive detector on the reference side of the sample was used to align the signal lens for optimized overlap of the focused signal and reference beams in the medium, and thus, optimized recording.

A variable attenuator and the half-wave plate/PBS assembly were used to control the power level during recording and/or read-out. This allows the μ-holographic recording characteristics of the optical data storage media to be measured as a function of the recording power and/or energy. This functional dependence distinguishes between a linear optical data storage medium/recording, where the strength of the recorded hologram is largely defined by the total amount of light energy received by the medium, but is independent of the light intensity, and a nonlinear, threshold optical data storage medium/recording, where the recording efficiency is highly dependent upon the intensity of the light. In a linear medium, a small exposure results in a low-strength hologram, which gradually grows with higher exposures. In contrast, in a non-linear, threshold medium, recording is only possible with intensity exceeding the threshold value.

During read-out, the signal beam was blocked, and the reference beam was reflected by the μ-holograms in the direction opposite to the incident direction. The reflected beam was coupled out from the incident beam path using the quarter-wave plate and a second polarizing beam splitter, and was collected on a calibrated photodiode in a confocal geometry to provide an absolute measure of the diffraction efficiency. By translating the sample with respect to the readout optics, it was possible to obtain a 3D profile of a micro-hologram diffraction response and evaluate dimensions of a micro-hologram.

The diffraction efficiency for Example 4 is expected to be from about 0.03% to about 0.26%, depending on the recording fluence. The diffraction efficiency for Example 5 was 0.43%; and the diffraction efficiency for Example 6 was 0.031%.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. An optical data storage medium for bit-wise recording of a microhologram using an incident radiation at a wavelength of about 405 nm, comprising:
   (a) a non-photopolymer polymer matrix;
   (b) a non-linear sensitizer comprising a phenylethynyl platinum complex, wherein the phenylethynyl platinum complex is a sequential two-photon reverse saturable absorber,
   wherein the non-linear sensitizer is capable of triplet-triplet energy transfer from an upper triplet state ($T_n$) of the non-linear sensitizer to a lower triplet state ($T_1$) of a reactant, wherein "n" is an integer greater than 1; and
   (c) a reactant capable of undergoing a chemical change upon the triplet-triplet energy transfer from the non-linear sensitizer, thereby causing a refractive index change in the medium to record the microhologram.

2. The optical data storage medium of claim 1, wherein the optical data storage medium is capable of recording the microhologram at 405 nm when an intensity of the incident radiation is greater than a threshold value, and
   wherein the optical data storage medium is substantially non-responsive to the incident radiation at 405 nm when the intensity of the incident radiation is lower than the threshold value.

3. The optical data storage medium of claim 1, wherein the non-linear sensitizer is substantially transparent to the incident radiation at about 405 nm when an intensity of the incident radiation is lower than a threshold value, and
   wherein the non-linear sensitizer is capable of absorbing the incident radiation at about 405 nm when the intensity of the incident radiation is greater than the threshold value, thereby transitioning to the upper triplet state $T_n$.

4. The optical data storage medium of claim 1, wherein the lowest triplet ($T_1$) energy of the reactant is greater than the lowest triplet energy ($T_1$) of the non-linear sensitizer and lower than or substantially equal to an upper triplet ($T_n$) energy of the non-linear sensitizer.

5. The optical data storage medium of claim 1, wherein a difference between the lowest triplet ($T_1$) energy of the reactant and the lowest triplet ($T_1$) energy of the non-linear sensitizer is greater than about 2 kcal/mole.

6. The optical data storage medium of claim 1, wherein a difference between the lowest triplet ($T_1$) energy of the reactant and the lowest triplet ($T_1$) energy of the non-linear sensitizer is greater than about 10 kcal/mole.

7. The optical data storage medium of claim 1, wherein the non-linear sensitizer comprises bis(tributylphosphine)bis(4-ethynylbiphenyl)platinum, bis(tributylphosphine)bis(4-ethynyl-1-(2-phenylethynyl)benzene)platinum, bis(1-ethynyl-4-(4-n-butylphenylethynyl)benzene)bis(tri-n-butyl) phosphine)Pt (II), bis(1-ethynyl-4-(4-fluorophenylethynyl)benzene)bis(tri-n-butyl)phosphine)Pt(II), bis(1-ethynyl-4-(4methoxyphenylethynyl)benzene)bis(tri-n-butyl) phosphine)Pt(II), bis(1-ethynyl-4-(4-methylphenylethynyl)benzene)bis(tri-n-butyl)phosphine)Pt (II), bis(1-ethynyl-4(3,5-dimethoxyphenylethynyl)benzene)bis(tri-nbutylphosphine)Pt(II), bis(1-ethynyl-4(4-N,N-dimethylaminophenylethynyl)benzene)bis(tri-n-butylphosphine)Pt(II), or combinations thereof.

8. The optical data storage medium of claim 1, wherein the optical data storage medium further comprises a mediator capable of transferring triplet energy from the non-linear sensitizer to the reactant.

9. The optical data storage medium of claim 8, wherein the mediator comprises acetophenone, dimethylphthalate, benzophenone, 9H-fluorene, biphenyl, phenanthrene, 1-napthonitrile, or combinations thereof.

10. The optical data storage medium of claim 1, wherein the medium is substantially free of the mediator.

11. The optical data storage medium of claim 1, wherein the reactant comprises stilbenes.

12. The optical data storage medium of claim 1, wherein the reactant comprises cinnamates, cinnamamides, or combinations thereof.

13. The optical data storage medium of claim 1, wherein the reactant is dispersed in the polymer matrix.

14. The optical data storage medium of claim 1, wherein the reactant is bonded to the polymer matrix.

15. The optical data storage medium of claim 1, wherein the polymer matrix comprises polyvinylalcohol, poly(alkyl methacrylate), poly(alkyl acrylate), polystyrene, polycarbonate, polyacrylate, poly(vinylidene chloride), poly(vinyl acetate), or combinations thereof.

16. The optical data storage medium of claim 1, wherein the microhologram is capable of being read without substantial reaction at a wavelength of about 405 nm and at an intensity lower than a threshold value.

17. The optical storage medium of claim 1, wherein the reactant is substantially non-responsive to the incident radiation.

18. An optical data storage medium for bit-wise recording of a microhologram using an incident radiation at a wavelength of about 405 nm, comprising:
   (a) a non-photopolymer polymer matrix;
   (b) a non-linear sensitizer comprising bis(tributylphosphine)bis(4-ethynylbiphenyl)platinum, bis(tributylphosphine)bis(4-ethynyl-1-(2-phenylethynyl)benzene)platinum, bis(1-ethynyl-4-(4-n-butylphenylethynyl)benzene)bis(tri-n-butyl) phosphine)Pt (II), bis(1-ethynyl-4-(4-fluorophenylethynyl)benzene)bis(tri-n-butyl) phosphine)Pt(II), bis(1-ethynyl-4-(4-methoxyphenylethynyl)benzene)bis(tri-n-butyl) phosphine)Pt(II), bis(1-ethynyl-4-(4-methylphenylethynyl)benzene)bis(tri-n-butyl) phosphine)Pt (II), bis(1-ethynyl-4(3,5-dimethoxyphenylethynyl)benzene)bis(tri-nbutylphosphine)Pt(II), bis(1-ethynyl-4(4-N,N-dimethylaminophenylethynyl)benzene)bis(tri-n-butylphosphine)Pt(II), or combinations thereof,
   wherein the non-linear sensitizer is capable of triplet-triplet energy transfer from an upper triplet state ($T_n$) of the non-linear sensitizer to a lower triplet state ($T_1$) of a reactant, wherein "n" is an integer greater than 1; and
   (c) a reactant capable of undergoing a chemical change upon the triplet-triplet energy transfer from the non-linear sensitizer, thereby causing a refractive index change in the medium to record the microhologram.

19. An optical data storage medium for bit-wise recording of a microhologram using an incident radiation at a wavelength of about 405 nm, comprising:
   (a) a non-photopolymer polymer matrix;
   (b) a non-linear sensitizer comprising a sequential two-photon reverse saturable absorber comprising a phenylethynyl platinum complex, wherein the non-linear sensitizer is capable of triplet-triplet energy transfer from an upper triplet state ($T_n$) of the non-linear sensitizer to a lower triplet state ($T_1$) of a reactant, wherein "n" is an integer greater than 1; and (c) a reactant comprising, cinnamates, cinnamades, or combinations thereof, wherein the reactant is capable of undergoing a chemical change upon the triplet-triplet energy transfer from the non-linear sensitizer, thereby causing a refractive index change in the medium to record the microhologram.

* * * * *

UNITED STATES PATENT AND TRADEMARK OFFICE
CERTIFICATE OF CORRECTION

PATENT NO. : 8,703,388 B2
APPLICATION NO. : 13/405681
DATED : April 22, 2014
INVENTOR(S) : Natarajan et al.

It is certified that error appears in the above-identified patent and that said Letters Patent is hereby corrected as shown below:

In the Specification

Column 1, Line 66, delete "in one" and insert -- In one --, therefor.

Column 2, Line 2, delete "includes a)" and insert -- includes (a) --, therefor.

Column 2, Line 65, delete "$T_n$," and insert -- $T_n$ --, therefor.

Column 3, Line 5, delete "PE2)" and insert -- (PE2) --, therefor.

Column 3, Line 30, delete "of total" and insert -- of a total --, therefor.

Column 3, Line 46, delete "tight." and insert -- light. --, therefor.

Column 4, Line 25, delete "his" and insert -- bis --, therefor.

Column 4, Line 32, delete "his" and insert -- bis --, therefor.

Column 4, Line 34, delete "his" and insert -- bis --, therefor.

Column 4, Line 43, delete "his" and insert -- bis --, therefor.

Column 5, Line 22, delete "his" and insert -- bis --, therefor.

Column 6, Line 15, delete "vinylidene;" and insert -- vinyl; vinylidene; --, therefor.

Column 6, Line 39, delete "survive)" and insert -- survive) may --, therefor.

Column 10, Line 56, delete "thereof" and insert -- thereof, --, therefor.

Column 11, Line 54, delete "tier" and insert -- for --, therefor.

Column 12, Line 46, delete "kcal/mot)," and insert -- kcal/mol), --, therefor.

Signed and Sealed this
Twenty-ninth Day of July, 2014

Michelle K. Lee
*Deputy Director of the United States Patent and Trademark Office*

CERTIFICATE OF CORRECTION (continued)

U.S. Pat. No. 8,703,388 B2

Column 12, Line 53, delete "kcal/mop," and insert -- kcal/mol), --, therefor.

Column 12, Line 63, delete "se" and insert -- self --, therefor.

Column 13, Line 19, delete "Tn," and insert -- Tn --, therefor.

Column 14, Line 41, delete "firmed" and insert -- formed --, therefor.

Column 14, Line 42, delete "pink," and insert -- pink --, therefor.

Column 14, Line 56, delete "6However," and insert -- However, --, therefor.

Column 15, Line 5, delete "Flourine" and insert -- Fluorine --, therefor.

Column 15, Line 16, delete "(11)" and insert -- (II) --, therefor.

Column 15, Line 23, delete "(1:0)." and insert -- (1:1)). --, therefor.

Column 16, Line 21, delete "(20 MO" and insert -- (20 mL) --, therefor.

Column 17, Line 19, delete "(d, J=8.11" and insert -- (d, J=8.1 --, therefor.

Column 17, Line 27, delete "(192 g," and insert -- (3.92g, --, therefor.

Column 17, Line 27, delete "(100 nit)" and insert -- (100 ml) --, therefor.

Column 17, Line 38, delete "(d, 8.2 Hz," and insert -- (d, J=8.2 Hz, --, therefor.

Column 17, Line 41, delete "1128.6," and insert -- 128.6, --, therefor.

Column 17, Line 42, delete "911.7," and insert -- 91.7, --, therefor.

Column 19, Line 61, delete "$^{1H}$NMR:" and insert -- 1HNMR: --, therefor.

Column 20, Line 36, delete "2.1.4 ppm" and insert -- 2.14 ppm --, therefor.

Column 20, Line 46, delete "mimic)" and insert -- mmole) --, therefor.

Column 21, Line 54, delete "cThe" and insert -- The --, therefor.

Column 22, Line 33, delete "1-position." and insert -- Z-position --, therefor.

Column 22, Line 34, delete "at tow" and insert -- at low --, therefor.